United States Patent
Stanley

(10) Patent No.: US 8,401,207 B2
(45) Date of Patent: Mar. 19, 2013

(54) MOTIONAL FEEDBACK SYSTEM

(75) Inventor: Gerald R. Stanley, Osceola, IN (US)

(73) Assignee: Harman International Industries, Incorporated, Stamford, CT (US)

( * ) Notice: Subject to any disclaimer, the term of this patent is extended or adjusted under 35 U.S.C. 154(b) by 336 days.

(21) Appl. No.: 12/748,097

(22) Filed: Mar. 26, 2010

(65) Prior Publication Data

US 2010/0246848 A1    Sep. 30, 2010

Related U.S. Application Data

(60) Provisional application No. 61/165,240, filed on Mar. 31, 2009.

(51) Int. Cl.
*H04R 3/00* (2006.01)
*H03F 99/00* (2009.01)
*H03F 1/36* (2006.01)

(52) U.S. Cl. ............................ 381/96; 381/121; 333/102

(58) Field of Classification Search .................. 381/96, 381/121, 120; 330/102
See application file for complete search history.

(56) References Cited

U.S. PATENT DOCUMENTS

| | | | |
|---|---|---|---|
| 1,779,126 A | 10/1930 | Graham | |
| 1,779,380 A | 10/1930 | Dudley | |
| 1,779,382 A | 10/1930 | Mathes | |
| 1,822,758 A | 9/1931 | Toulon | |
| 2,099,769 A | 11/1937 | Nyquist | 178/44 |
| 2,102,671 A | 12/1937 | Black | 178/44 |
| 2,194,175 A | 3/1940 | Wilhelm | 179/1 |
| 2,841,648 A | 7/1958 | Thurston | 179/1 |
| 2,843,671 A | 7/1958 | Wilkins et al. | 179/1 |
| 2,860,183 A | 11/1958 | Conrad | 179/1 |
| 2,887,532 A | 5/1959 | Werner | 179/1 |
| 2,948,778 A | 8/1960 | Clements | 179/1 |
| 3,009,991 A | 11/1961 | Bekey | 179/1 |
| 3,047,661 A | 7/1962 | Winker | 179/1 |
| 3,057,961 A | 10/1962 | Turner | 179/1 |
| 3,073,899 A | 1/1963 | Farnsworth | 179/1 |
| 3,118,972 A | 1/1964 | Walczak | 179/1 |
| 3,530,244 A | 9/1970 | Reiffin | 179/1 |
| 3,798,374 A | 3/1974 | Meyers | 179/1 F |

(Continued)

FOREIGN PATENT DOCUMENTS

EP    0 339 470 A2    11/1989
JP    1-272298    10/1989

(Continued)

OTHER PUBLICATIONS

Birt, M., "Loudspeaker power amplifiers with load-adaptive source impedance," JAES vol. 36, No. 7/8, Jul./Aug. 1988, pp. 552-561.

(Continued)

*Primary Examiner* — Xu Mei
*Assistant Examiner* — David Ton
(74) *Attorney, Agent, or Firm* — Brinks Hofer Gilson & Lione

(57) ABSTRACT

An audio amplifier is operated in an audio system with optimized source impedance to minimize distortion in a loudspeaker that is paired with the audio amplifier. The audio amplifier provides an amplified audio signal to drive the loudspeaker. A variable output impedance of the audio amplifier is controlled using a feedback control loop to allow negative output impedance at low frequencies that changes to positive output impedance at higher frequencies. The change from negative output impedance to positive output impedance occurs at a determined threshold frequency or determined transitional frequency band.

25 Claims, 32 Drawing Sheets

U.S. PATENT DOCUMENTS

| | | | | |
|---|---|---|---|---|
| 3,821,473 | A | 6/1974 | Mullins | 179/1 F |
| 3,889,060 | A | 6/1975 | Goto et al. | 179/1 F |
| 4,118,600 | A | 10/1978 | Stahl | 179/1 D |
| 4,170,742 | A | 10/1979 | Itagaki et al. | 310/324 |
| 4,180,706 | A | 12/1979 | Bakgaard | 179/1 F |
| 4,207,430 | A | 6/1980 | Harada et al. | 179/1 F |
| 4,276,443 | A | 6/1981 | Meyers | 179/1 F |
| 4,455,675 | A | 6/1984 | Bose et al. | 381/74 |
| 4,488,012 | A | 12/1984 | Matsuda et al. | 179/115.5 R |
| 4,494,074 | A | 1/1985 | Bose | 330/109 |
| 4,550,430 | A | 10/1985 | Meyers | 381/96 |
| 4,573,189 | A | 2/1986 | Hall | 381/96 |
| 4,609,784 | A | 9/1986 | Miller | 179/115.5 DV |
| 4,727,584 | A | 2/1988 | Hall | 381/96 |
| 4,741,040 | A | 4/1988 | Kaizer | 381/103 |
| 4,799,265 | A | 1/1989 | Streng | 381/116 |
| 4,821,328 | A | 4/1989 | Drozdowski | 381/96 |
| 4,908,870 | A | 3/1990 | Nagi | 381/96 |
| 4,943,956 | A * | 7/1990 | Noro | 367/137 |
| 4,980,920 | A * | 12/1990 | Noro et al. | 381/96 |
| 5,009,280 | A | 4/1991 | Yokoyama | 181/160 |
| 5,009,281 | A | 4/1991 | Yokoyama | 181/160 |
| 5,031,221 | A | 7/1991 | Yokoyama | 381/96 |
| 5,109,422 | A | 4/1992 | Furukawa | 381/96 |
| 5,173,575 | A | 12/1992 | Furukawa | 181/160 |
| 5,197,104 | A | 3/1993 | Padi | 381/192 |
| 5,206,912 | A * | 4/1993 | Noro | 381/96 |
| 5,280,543 | A | 1/1994 | Yokoyama et al. | 381/96 |
| 5,394,478 | A | 2/1995 | Hathaway et al. | 381/154 |
| 5,408,533 | A | 4/1995 | Reiffin | 381/96 |
| 5,493,620 | A | 2/1996 | Pulfrey | 381/96 |
| 5,533,134 | A | 7/1996 | Tokura et al. | 381/96 |
| 5,542,001 | A | 7/1996 | Reiffin | 381/96 |
| 5,764,781 | A | 6/1998 | Ding | 381/96 |
| 6,104,817 | A | 8/2000 | Ding | 381/96 |
| 6,975,734 | B1 * | 12/2005 | Suzuki | 381/121 |
| 7,053,705 | B2 * | 5/2006 | Hench et al. | 330/102 |
| 7,113,607 | B1 | 9/2006 | Mullins | 381/96 |
| 7,260,229 | B2 | 8/2007 | Hlibowicki | 381/96 |
| 7,912,233 | B2 * | 3/2011 | Takagi et al. | 381/118 |
| 2003/0072462 | A1 | 4/2003 | Hlibowicki | 381/96 |
| 2003/0108213 | A1 | 6/2003 | Tanaka | 381/93 |
| 2007/0154021 | A1 | 7/2007 | Bohman | 381/59 |
| 2010/0080403 | A1 * | 4/2010 | Bray | 381/107 |

FOREIGN PATENT DOCUMENTS

| | | |
|---|---|---|
| JP | 3-187599 | 8/1991 |

OTHER PUBLICATIONS

Mills, P.G.L. & Hawksford, M.O.J., "Distortion reduction in moving-coil loudspeaker systems using current-drive technology," JAES vol. 37, No. 3, Mar. 1989, pp. 129-148.

R.E. Werner—"Loudspeakers and Negative Impedances"—IRE Tran. on Audio Jul./Aug. 1958 p. 83-89.

H.H. Scott—"Power amplifiers for music reproduction" JAES vol. 3, No. 3, Jul. 1955 p. 132-142.

C.A. Wilkins—"Control of amplifier source resistance" JAES vol. 4 No. 1, Jan. 1956 p. 9-13.

R.E. Werner & R.M. Carrell—"Application of negative impedance amplifiers to loudspeaker systems" JAES vol. 6 No. 4 p. 240-243.

R.E. Werner—"Effect of a negative impedance source on loudspeaker performance"—JASA vol. 29 No. 3, Mar. 1957 p. 335-340.

W. Steiger—"Transistor power amplifiers with negative output impedance" IRE Tran. on Audio Nov./Dec. 1960 p. 195-201.

W.H. Pierce—"The use of pole-zero concepts in loudspeaker feedback compensation" IRE Tran. on Audio Nov./Dec. 1960 p. 229-234.

E. De Boer—"Theory of Motional Feedback"—IRE Tran. on Audio Jan./Feb. 1961 p. 15-21.

H.W. Holdaway—"Design of velocity-feedback transducer systems for stable low-frequency behavior" IEEE Tran. on Audio Sep./Oct. 1963 p. 155-173.

H.W. Holdaway—"Controlling the upper frequency characteristics of velocity-feedback loudspeaker systems" IEEE Tran. on Audio Sep./Oct. 1963 p. 174-182.

E.R. Hanson—"A motional feedback loudspeaker system" $46^{th}$ AES Conv. 1973 preprint #924.

J.H. Levitt—"Impedance tailoring via feedback" JAES vol. 23 No. 6 Jun. 1975 p. 466-469.

G. Penkov—"Principles and realization of motional feedback" $56^{th}$ AES Conv. 1977 preprint #1202.

K.E. Stahl—"Synthesis of loudspeaker mechanical parameters by electrical means: A new method for controlling low-frequency loudspeaker behavior" JAES vol. 29 No. 9 Sep. 1981 p. 587-596.

R.A. Greiner & T.M. Sims—"Loudspeaker distortion reduction" JAES vol. 32 No. 12 Dec. 1984 p. 956-963.

J.A.M. Catrysse—"On the design of some feedback circuits for loudspeakers" JAES vol. 33 No. 6 Jun. 1985 p. 430-435.

D.S. Hall—"Design considerations for an accelerometer-based dynamic loudspeaker motional feedback system" $87^{th}$ AES Conv. 1989 preprint #2863.

D. Birt—"A motion transducer for low-frequency loudspeakers" $91^{st}$ AES Conv. 1991 preprint #3196.

M.A.H. Beerling & C.H. Slump—"Reduction of nonlinear distortion in loudspeakers with digital motional feedback" $96^{th}$ AES Conv. 1994 preprint #3820.

T.S. Hsu & K.A. Poorina—"Electronic damping for dynamic drivers in vented enclosures" JAES vol. 47 No. 1 /2 Jan./Feb. 1999 p. 32-38.

M.R. Bai & H. Wu—"Robust control of a sensorless bass-enhanced moving-coil loudspeaker system" JASA vol. 105 No. 6 Jun. 1999 p. 3283-3289.

J.H. Mullins—"A low-frequency feedback-controlled audio system" JASA vol. 106 No. 2, Aug. 1999 p. 739-747.

P. Robineau & M. Rossi—"Current controlled vented box loudspeaker system with motional feedback" $108^{th}$ AES Conv. 2000 preprint #5110.

J.J. Friend—"A single operational-amplifier biquadratic filter section" IEEE ISCT Dig. Tech. Papers 1970 p. 179.

J.J. Friend, C.A. Harris & D. Hilberman—"STAR: An active biquadratic filter section" IEEE CAS-22 No. 2 1975 p. 115-121.

L.T. Bruton—"Sensitivity comparisonof high-Q second-order active filter synthesis techniques" IEEE CAS-22 No. 1 1975 p. 32-38.

S.A. Boctor—"A novel second-order canonical RC-active realization of high-pass notch filter"—IEEE CAS-22 No. 5 1975 p. 397-404.

P.R. Sallen & E.L. Key—A practical method of designing RC active filters IRE CT-2 1955 p. 74-85.

T. Delyiannis—"High Q-factor circuit with reduced sensitivity" Electronic Lett. Dec. 4, 1968 p. 577.

A.S. Sedra—"Generation and classification of single amplifier filters"—Int. J. Circuit Theory Mar. 2, 1974 p. 51-67.

A.S. Sedra & L. Brown—"A refined classification of single amplifier filters"—Int. J. Circuit Theory Mar. 7, 1979 p. 127-137.

A.S. Sedra—"A class of stable filters using unity-gain voltage followers" IEEE JSSC Aug. 1972 p. 311-315.

T.A. Hamilton & A.S. Sedra—"Some new configurations for active filters" IEEE CT-19 No. 1 Jan. 1972 p. 25-33.

T.A. Hamilton & A.S. Sedra—"A single amplifier biquad active filter" IEEE CT-19 No. 7 Jul. 1972 p. 398-403.

A.S. Sedra & W.L. Brown—"A simple all-pass network with complex poles and zeroes" IEEE CT-20 No. 7 Jul. 1973 p. 445-446.

A.S. Sedra & J.L. Espinoza—"Sensitivity and frequency limitations of biquadratic active filters" IEEE CAS-22 No. 2 Feb. 1975 p. 122-130.

A.S. Sedra, M.A. Ghorab & K. Martin—"Optimum configurations for single-amplifier biquadratic filters" CAS-27 No. 12 Dec. 1980 p. 1155-1163.

G.W. Roberts & A.S. Sedra—"A general class of current amplifier-based biquadratic filter circuits" IEEE CAS-39 No. 4 Apr. 1992 p. 257-263.

European Search Report, dated Jul. 22, 2010, pp. 1-8, European Patent Application No. 10158371.4-2225, European Patent Office, Germany.

Thiele, A. N., Loudspeakers in Vented Boxes: Part II, JAES, vol. 19, No. 16, Jun. 1971, pp. 471-483.

Japanese Patent Application No. 2010-79860, Office Action mailed Dec. 14, 2011, 10 pgs.

* cited by examiner

MOTIONAL FEEDBACK SYSTEM

PRIORITY CLAIM

This application claims the benefit of priority from U.S. Provisional Application No. 61/165,240, filed Mar. 31, 2009, which is incorporated by reference.

BACKGROUND OF THE INVENTION

1. Technical Field

The present invention relates to audio systems, and more particularly to motional feedback related control of loudspeakers in an audio system.

2. Related Art

Audio systems typically include an audio source providing audio content in the form of an audio signal, an amplifier to amplify the audio signal, and one or more loudspeakers to convert the amplified audio signal to sound waves. Loudspeakers are typically indicated by a loudspeaker manufacturer as having a nominal impedance value, such as 4 ohms or 8 ohms. In reality, the impedance of a loudspeaker, and thus the load on an amplifier driving the loudspeaker varies with frequency. In addition the impedance of a loudspeaker is often significantly non-linear. Variations in loudspeaker impedance with respect to frequency may be shown with a loudspeaker impedance curve, which is often provided by the manufacturer with a manufactured model of a loudspeaker. The non-linear aspects of the load impedance are never published.

Non-linear operation of a loudspeaker is also due to it being an electro-mechanical device that is sensitive to variations in voltage and current. Further, non-linear operation of a loudspeaker may be due to displacement and aging, as well as environmental conditions, such as temperature and humidity. In addition, during operation a loudspeaker voice coil may be subject to heating and cooling dependent on the level of amplification of the audio content. Moreover, variations in manufacturing and materials among a particular loudspeaker design may also cause/contribute to non-linear operation of a loudspeaker. As such, loudspeaker parameters such as the DC resistance, moving mass, compliance, resonance frequency and inductance may vary significantly among the same manufactured model of a loudspeaker, and also may change significantly as operating and environmental conditions change.

Since non-linear operation of the loudspeaker and the corresponding changing impedance of the loudspeaker can vary dramatically for any given loudspeaker, resulting distortion when the loudspeaker is driven by an amplifier with an amplified audio signal can also be dramatically different among different loudspeakers, and under different operating to conditions.

SUMMARY

An audio system having a voltage controlled audio amplifier driving a loudspeaker with an amplified audio signal may include an impedance control module. The impedance control module may cooperatively operate with the audio amplifier to optimize an output impedance of the audio amplifier in order to minimize loudspeaker distortion. In such a system the audio amplifier may first be paired with the particular loudspeaker or loudspeakers. Based on the pairing, the impedance control module may be provided with an estimated optimum source impedance for the loudspeaker(s). The impedance control module may include a filter designed to be representative of the optimum source impedance for the particular loudspeaker(s) paired with the amplifier.

During operation of the audio amplifier, the impedance control module may operate as a frequency based current feedback control. Using the filter and a measured current included in the amplified audio signal driving the loudspeaker, the impedance control module may control the output impedance of the audio amplifier over a range of frequencies. At low frequencies the output impedance of the amplifier may be controlled to be substantially equal and opposite to at least some aspects of the load impedance of the loudspeaker. At high frequencies, on the other hand, the amplifier may resemble a current source having high output impedance. The aspects of the load impedance of the loudspeaker such as voice coil related impedance and leakage inductance may facilitate non-linear operation of the loudspeaker, which results in distortion in audible sound produced by the loudspeaker.

Since the low-frequency output impedance of the amplifier is controlled to be equal and opposite to the blocked load impedance (voice coil related impedance) of the loudspeaker, cancellation of the portion of the load impedance that is not part of the motional impedance associated with the moving-coil back-EMF of the loudspeaker may occur. The high frequency output impedance of the amplifier, on the other hand, may be significantly higher than the low frequency output impedance in order to minimize the effects of the leakage inductance. The effects of the leakage inductance of the loudspeaker may be minimized by increasing the output impedance of the amplifier to be the majority of the impedance in the circuit formed between the amplifier and the loudspeaker. As a result, distortion of the loudspeaker output due to non-linear low-frequency operation and non-linear high frequency operation may be minimized.

The output impedance of the audio amplifier may be controlled to provide a negative output impedance below a threshold frequency, and a positive output impedance above a threshold frequency. The threshold frequency may be determined by testing to minimize distortion of the loudspeaker. The negative output impedance may be a result of frequency based positive feedback current provided by the impedance control module. Similarly, the positive output impedance may be a result of frequency based negative feedback current provided by the impedance control module. Using these frequency based control techniques, the output impedance of the audio amplifier may be controlled by the impedance control module to output negative output impedance at low frequencies that changes to positive output impedance at higher frequencies based on the threshold frequency. Due to the negative output impedance, load impedance of the loudspeaker, such as voice coil resistance, may be negated at low frequencies. In addition, the voltage controlled audio amplifier may operate similar to a current controlled audio amplifier using the positive output impedance at higher frequencies to overwhelm and exceed the impedance of the leakage inductance of the loudspeaker.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention may be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

Figure 1:
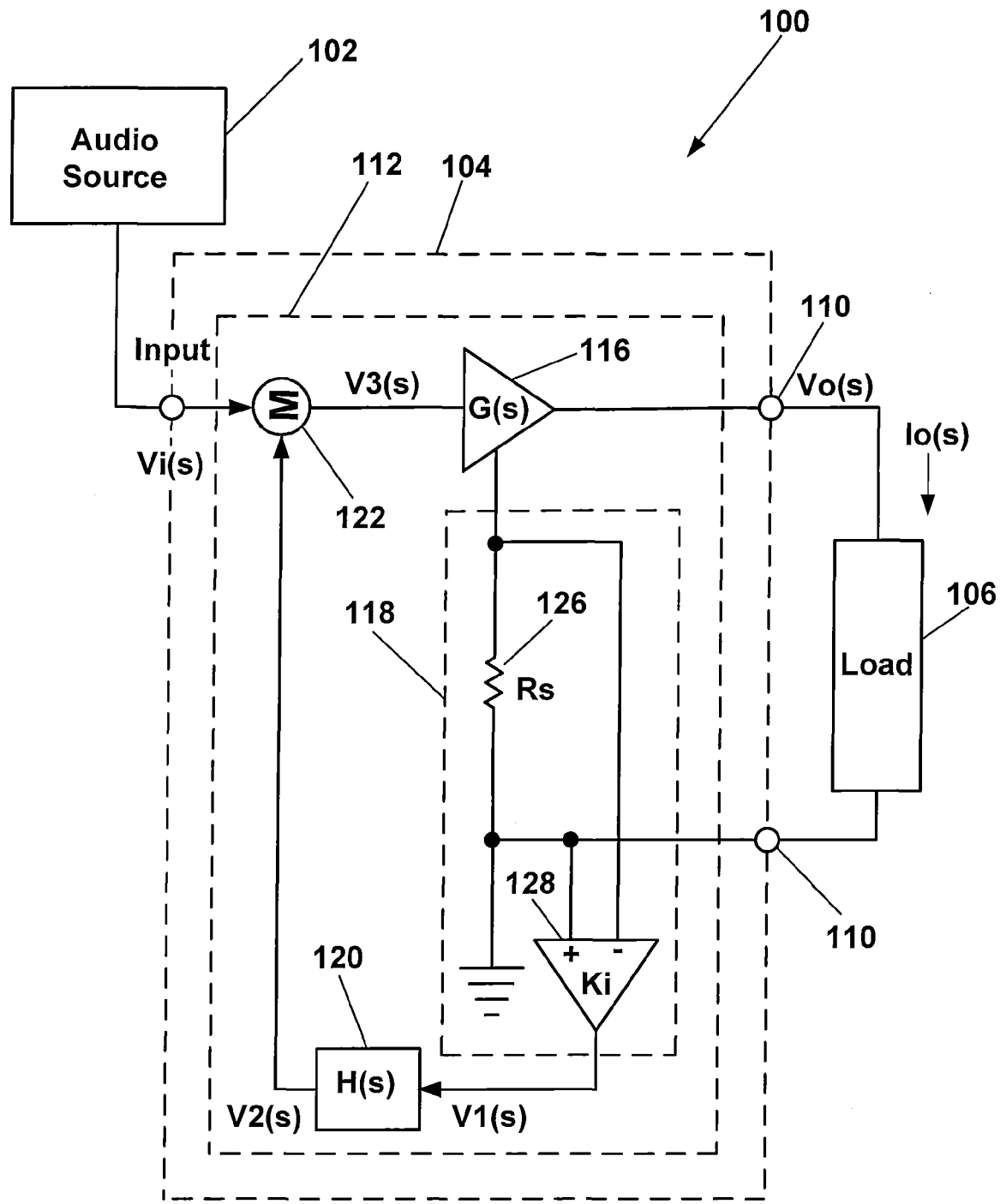
FIG. 1 is an example block diagram of a portion of an audio system that includes an audio source and a motional feedback system containing an audio amplifier and a loudspeaker.

FIG. 1 is a block diagram of an example audio system that includes a motional feedback system 100 and an audio source 102. The audio system may be operated in any listening space such as a room, a vehicle, or in any other space where a system capable of producing audible sound can be operated. The audio system may be any form of multimedia system capable of providing audio content. In other examples, the configuration of the audio system may include additional components, such as pre or post equalization capability, a head unit, a navigation unit, an onboard computer, a wireless communication unit, and/or any other audio system related functionality.

The audio source 102 may be a source of live sound, such as a singer or a commentator, a media player, such as a compact disc, video disc player, a video system, a radio, a cassette tape player, an audio storage device, a audio/video storage device, a wireless or wireline communication device, a navigation system, a personal computer, or any other functionality or device that may be present in any form of multimedia system. During operation, the audio source 102 may supply a digital signal or an analog signal as the audio signal. The audio signal may include audio data representative of a mono signal, a stereo signal, or a multi-channel signal such as a 5, 6, or 7 channel surround audio signal. The audio signal may vary in current and/or voltage as the audio content varies over a wide range of frequencies that includes 16 Hz to 20 kHz, a range of frequencies within 16 Hz to 20 kHz, and/or multiple ranges of frequency within 16 Hz to 20 kHz.

The motional feedback system 100 may include an audio amplifier 104, and a load 106. The audio amplifier 104 may be one or more voltage amplifiers or any other mechanism(s) or device(s) capable of receiving an audio input signal, increasing a magnitude of the audio input signal, and providing a voltage based amplified audio output signal to drive the load 106. The audio amplifier 104 may also perform any other processing of the audio signal, such as equalization, phase delay and/or filtering.

The motional feedback system 100 may be hardware in the form of electronic circuits and related components, software stored as instructions in a tangible computer readable medium that are executable by a processor, such as digital signal processor, or a combination of hardware and software. The tangible computer readable medium (memory) may be any form of data storage device or mechanism such as non-volatile or volatile memory, read only memory (ROM), random access memory (RAM), flash memory, a hard disk, an optical disk, a magnetic storage media and the like. The tangible computer readable media is not a communication signal capable of electronic transmission. In one example, the motional feedback system 100 may be implemented with a digital signal processor and associated memory within the audio amplifier 104. In other examples, the motional feedback system 100 may be external to the audio amplifier 104 and provide one or more control outputs to control the audio amplifier 104. The audio amplifier 104 includes an output 110. The output 110 may have a variable output source impedance Zo(s) and be capable of supplying an amplified audio signal to the load 106.

The load 106 may be any number of electro-mechanical devices such as loudspeakers operable to convert audio signals to sound waves. The loudspeakers may be any size, contain any number of different sound emitting surfaces or devices, and operate in any range or ranges of frequency. Although the load 106 may include other devices, such as post filtering (crossovers), global volume control, and other devices or circuits, for purposes of the remaining discussion, the load 106 will be referred to as a loudspeaker 106.

The example audio amplifier 104 includes an impedance control module 112. During operation, the impedance control module 112 may optimize the variable output impedance Zo(s) of the output 110. Optimization of the variable output impedance Zo(s) may be performed to reduce distortion in the loudspeaker 106 as the loudspeaker 106 is being driven by an amplified audio signal via the output 110. Optimization may involve the variable output impedance Zo(s) of the audio amplifier 104 being controlled to be substantially similar and opposite to a load impedance Z(s) of the loudspeaker 106 at low frequencies, and being controlled to be much larger than the load impedance Z(s) of the loudspeaker 106 at higher frequencies. The substantially similar but opposite output impedance Zo(s) of the audio amplifier 104 at low frequencies may result in cancellation of at least a substantial portion of the load impedance of the loudspeaker 106 that otherwise facilitates non-linear operation. In addition, the output impedance Zo(s) being controlled to be much larger than the load impedance Z(s) of the loudspeaker 106 at high frequencies may minimize the effect of the load impedance Z(s) at higher frequencies on non-linear operation of the loudspeaker 106.

Thus, prior to commencing operation, the load impedance Z(s) of the loudspeaker 106 may be determined based on testing, manufacturer's data, and/or any other mechanism for establishing a base line frequency based value of load impedance Z(s) for the particular one or more loudspeakers 106 that the audio amplifier 104 will be driving with an audio signal. The loudspeaker 106 may also be tested in such a manner as to block the motion of the voice coil and the load impedance is measured. This is known as the blocked voice coil impedance since motional impedance is excluded. Testing of the load impedance Z(s) may also include determination of the leakage inductance of the loudspeaker. Since the load impedance Z(s) of the loudspeaker 106 may change significantly during operation, variations in the load impedance Z(s) may be considered when automatically and dynamically adjusting the output impedance Zo(s) of the audio amplifier 104 to a range of load impedance Z(s) of the loudspeaker 106 within a range of frequency of operation. In one example, pre-operational determination of the load impedance Z(s) of the loudspeaker 106, and substantially similar but opposite output impedance Zo(s) of the audio amplifier 104 for low frequency operation and determination of the amount of impedance needed to dominate the leakage inductance of the loudspeaker 106 at higher frequencies may be performed with network synthesis in which both the particular loudspeaker 106 and the particular audio amplifier 104 are modeled in the same synthesis. In other words, the particular audio amplifier 104 may be matched to or paired with the particular one or more loudspeakers 106 by taking into consideration loudspeaker impedance at low frequencies and loudspeaker impedance at high frequencies that contributes to non-linear operation.

Variations in the load impedance Z(s) of the loudspeaker 106 may be due to the loud speaker 106 being driven by the audio signal, temperature, tolerances of the parts included in the loudspeaker 106, and any other variables having a significant impact on the load impedance Z(s) throughout the frequency range. One mechanism for tracking and compensating for these variations in the load impedance Z(s) may include monitoring real-time position and velocity of the moving voice coil in the loudspeaker 106. However, systems providing real-time positional and velocity feedback are typically complex, expensive and meet with limited success.

An alternative approach performed with the impedance control module 112 is to control the output impedance Zo(s) of the audio amplifier 104 using current feedback. Controlling the output impedance Zo(s) of the audio amplifier 104 allows the same voice coil that is being used to supply driving force to the loudspeaker 106 to also provide implicit feedback. Using the impedance control module 112 both an adjustable negative and positive output impedance Zo(s) of the audio amplifier 104 may be controlled in order to improve damping and lower loudspeaker distortion.

At relatively low frequencies of the audio signal, such as 16 Hz to 200 Hz a dominant source of error resulting in non-linearity is due to loss of voltage from the audio signal in the resistance of the voice coil of the loudspeaker 106. The loss of voltage from the audio signal in the resistance of the voice coil of the loudspeaker is due to the current flow of the audio signal in the voice coil forcing a non-linear compliance to deform. To much less significant degree at such low frequencies, voice coil leakage inductance contributes to the non-linearity of the loudspeaker 106. At such low frequencies, due to the relatively large opposition to the reciprocating movement of the voice coil, the magnitude of the voltage lost to the resistance of the voice coil dominates over the voltage lost to the leakage inductance. An example measurement of the resistance of the voice coil may be based on a blocked (immobilized) voice coil impedance, as previously discussed. At higher frequencies, reciprocating movement of the voice coil decreases significantly causing the voltage lost due to the non-linear leakage inductance to dominate the distortion over voltage lost in the more linear resistance of the voice coil. The impedance control module 112 may substantially negate the blocked voice coil impedance of the loudspeaker 106 at low frequencies of the audio signal by controlling the output impedance Zo(s) of the audio amplifier 104. In practice, the majority of the output impedance Zo(s) at low frequencies is resistive due to the dominating effect of the voice coil resistance.

The output impedance Zo(s) of the audio amplifier 104 may be controlled using positive current feedback to synthesize a negative output impedance at the output 110. The negative output impedance Zo(s) of the audio amplifier 104 may substantially cancel the voice coil resistance at low frequencies thereby reducing non-linearity of loudspeaker performance in this regard. The voice coil resistance may be substantially canceled due to product tolerances and operational factors. Product tolerance allowances may be included for both the electronics of the amplifier and the loudspeaker. For example, one relatively large tolerance is the loudspeaker vs. temperature. In specific applications, such as an automotive application the normal extreme of temperature is −40 deg C. where the copper conductivity of a loudspeaker may be maximized. In such automotive application both the voice coil and the wiring harness of the vehicle will be cold at the same time. At relatively high temperatures the voice coil resistance is higher.

Once the blocked voice coil impedance has been determined and substantially canceled with negative output impedances Zo(s) of the audio amplifier 104, there remains significant sources of non-linearity which are substantially unaffected by the negative output impedances Zo(s). For example, another source of non-linearity is the leakage inductance of the voice coil which is the remaining load impedance Z(s) component of the voice coil voltage being driven with the audio signal to operate the loudspeaker 106. This remaining load impedance Z(s) component of the voice coil voltage is representative of the motor BL product times the velocity of the voice coil. The motor BL product includes B, which is the flux density of the motor, and L which is the length of voice coil wire exposed to B. BL may vary as a function of voice coil displacement, and the blocked voice coil impedance may change as a function of time or the content of the audio signal.

Still another possible source of non-linearity that is not canceled with negative output impedances Zo(s) of the audio amplifier 104 is the effect of temperature on the voice coil. The voice coil resistance may have a substantial positive temperature coefficient, such as when the voice coil wire is copper, and may increase with voice coil heating, such as heating created by the audio signal. For example, high power loudspeakers often see growth in the DC resistance of 100% when being driven by relatively high energy audio signals. This may produce compression of the output signal of the loudspeaker 106, which may be heard by a listener as an audible defect. Also the leakage inductance of the loudspeaker 106 is modulated by the field of the voice coil when that field enters the motor's pole pieces.

The impedance control module 112 may substantially minimize the effect of both the temperature sensitive resistance and the distortion resulting from non-linear voice coil inductance by controlling the output impedance of the amplifier 104 to provide a positive impedance at the output 110, which is the very antithesis of the negative resistance source. The output impedance Zo(s) of the audio amplifier 104 may be controlled using negative current feedback to synthesize a positive output impedance at the output 110 in a range of high frequencies similar to a current amplifier.

The positive output impedances Zo(s) of the audio amplifier 104 may be a relatively high impedance that substantially exceeds the load impedance related to at least one of the temperature sensitive resistance and the voice coil inductance of the loudspeaker 106. The positive output impedances Zo(s) may be large enough to dominate the circuit or mesh formed between the output of the audio amplifier 104 and the loudspeaker input terminals. As such, the positive output impedances Zo(s) dominates or marginalizes the temperature sensitive resistance and the non-linear voice coil inductance of the loudspeaker due to the substantial difference in relative impedance. In other words, the positive output impedances Zo(s) is so much larger when compared to the temperature sensitive resistance and the non-linear voice coil inductance in the circuit, that the non-linear behavior of the loudspeaker 106 due to the temperature sensitive resistance and voice coil inductance is minimized.

In one example, the impedance control module 112 may be used to create a highly linear low-frequency motor with a large measure of BL linearity vs. position with an under-hung voice coil design and modern high field magnets. A low frequency motor may operate in a desired range of low frequency, such as 20 Hz to 100 Hz, however, in other examples, the upper and lower frequency limits may be different since they are audio system dependent.

Under the control of the impedance control module 112, the driving amplifier 104 may present a negative impedance at lower frequencies while at the same time presenting a positive impedance at higher frequencies such that both positive and negative impedance is provided at the output 110 over respective ranges of frequencies. Thus, the motional feedback system 100 may maximize the linearity of the loudspeaker 106 over a frequency range using both positive and negative feedback to output both negative impedance at low frequencies and positive impedance at high frequencies.

In FIG. 1, an example of a general form of output impedance synthesis using a full-bandwidth voltage amplifier 104 that includes the impedance control module 112 is illustrated. The impedance control module 112 includes an output amplifier 116, a current sensor 118, a filter 120, and a summer 122. The output amplifier 116 may operate to amplify a modified input voltage V3(s) included in an audio signal by a amplifier gain G(s) to generate an output voltage Vo(s) in the amplified audio signal to drive the loudspeaker 106 based on:

$$Vo(s)=V3(s)*G(s) \qquad \text{Equation 1}$$

The amplified audio signal may also include an output current Io(s).

The current sensor 118 may be any device or mechanism included within the audio amplifier 104 to measure and provide a signal representative of the output current Io(s) included in the amplified audio signal. In FIG. 1, the current sensor 118 includes a resistor Rs 126 and a voltage amplifier 128 having a voltage gain Ki. The resistor Rs 126 may be an internal resistance included in the audio amplifier 104 that is subject to the output current Io(s). The internal resistance may be a determined resistance resulting in a voltage drop when the output current Io(s) is flowing. The voltage dropped across the resistor Rs 126 may be amplified by the voltage amplifier 128 based on the gain Ki to generate a sensed voltage V1(s) representative of the output current Io(s) based on:

$$V1(s)=Io(s)*Rs*Ki \qquad \text{Equation 2}$$

In other examples, a hall effect sensor, a current transformer, or any other form of current sensing device or mechanism may be used for the current sensor 118 to produce the sensed voltage V1(s). The sensed voltage V1(s) may be received by the filter 120.

The filter 120 may be an active filter having a filter response H(s). The filter response H(s) may be representative of an optimum source impedance Z(s) for the loudspeaker 106. As described later, the filter response H(s) includes a frequency dependent phase inversion and a frequency dependent gain in order to model the best amplifier source impedance Zo(s) to drive loudspeaker 106 within both a low frequency range and a high frequency range. In other words, the filter response H(s) is tailored to substantially match an optimum source impedance for the loudspeaker providing a variable phase and gain that may change as a function of the frequency of the audio signal. Application of the sensed voltage V1(s) to the filter 120 results in application of frequency based phase and gain adjustments to the sensed voltage V1(s). The resulting filtered voltage V2(s) is provided based on:

$$V2(s)=V1(s)*H(s) \quad \text{Equation 3}$$

The filtered voltage V2(s) is an error signal that is supplied to the summer 122 for summation with the input voltage V1(s). The input voltage V1(s) is included in the audio signal supplied from the audio source 102. The output of the summer 122 is the modified input voltage V3(s) based on:

$$V3(s)=V2(s)+V1(s) \quad \text{Equation 4}$$

The combination of the sensor 118 and the filter 120 provides a current feedback loop within the audio amplifier 104 using the summer 122. The modified input voltage V3(s) is representative of a modified demand voltage that is now conditioned to better represent the desired voltage to be amplified and drive the loudspeaker 106 in order to minimize distortion of the loudspeaker 106.

When a wide-band voltage amplifier 104 is used, gain G(s) may take the form of a constant. In this example, Gain G(s) is understood to be the gain of the amplifier 104 inclusive of any voltage lost to the internal resistor Rs 126. The effect is that the expression for the source impedance Zo(s) of the loudspeaker 106 is of the form of a constant times the filter response H(s) when Vi(s)=0 based on:

$$Vo(s)=V2(s)*G(s)$$

$$Zo(s)=Vo(s)/Io(s) \text{ therefore:}$$

$$Zo(s)=Rs*Ki*H(s)*G(s) \quad \text{Equation 5}$$

Based on Equation 5, the poles and zeroes of the filter response H(s) may be made substantially similar to the poles and zeroes of the load impedance Z(s) of a particular loudspeaker 106 or any other constructable impedance function Z(s). The poles and zeroes of the load impedance Z(s) of a particular loudspeaker 106 may refer to the linear part of the load impedance Z(s) of the loudspeaker exclusive of non-linear portions or portions of the load impedance that are non-stationary. This is not to say that any constructible filter with a filter response H(s) can be used for the filter 120 since not all closed-loop systems will be stable under all conditions. The load impedance Z(s) of the loudspeaker 106 is an important part of the closed-loop feedback network since the transfer function of the filter 120 should substantially match the load impedance of the loudspeaker 106. The overall loop gain LG(s) of the feedback loop is:

$$LG(s)=Rs*Ki*H(s)*G(s)/Zo(s) \quad \text{(Equation 6)}$$

To remain stable, the complex function of Equation 6 must not enclose +1 (Nyquist stability criterion). Each motional feedback system 100 must be analyzed as a complete system, including the audio amplifier 104 paired with the particular loudspeaker 106 to develop the transfer function H(s). In addition, the acoustic system including the loudspeaker 106 must be modeled for all adjustable parameters and tolerances including temperature. Accordingly, modeling of the loudspeaker 106 should assume a lowest possible resistance of the voice coil, such as at a temperature of −40 degrees Celsius to a highest possible resistance of the voice coil, such as at a temperature of +150 degrees Celsius. The highest temperatures may be self-induced with large signals. In general, the high temperature cases will likely be stable situations whereas the low temperature cases may not.

Once the loudspeaker load impedance Z(s) is determined from modeling the system, the impedance control module 112 may perform frequency based control of the variable output impedance of the output 110. The impedance control module 112 may vary the output impedance of the output 110 to represent a negative impedance for those frequencies of the audio signal below a determined threshold frequency. In addition, the impedance control module 112 may vary the output impedance of the output 110 to represent a positive impedance for those frequencies above a determined threshold frequency. Thus, within the available range of frequencies, the determined threshold frequency may define a low frequency (LF) region or band or frequencies below the determined threshold frequency, and a high frequency (HF) region or band of frequencies above the determined threshold frequency. The band of frequencies present in the LF region may be from about 16 Hz up to the determined threshold frequency, and the band of frequencies in the HF region may be from the determined threshold frequency up to about 20 kHz.

The determined threshold frequency may be a single frequency, a range of frequencies, or a transition frequency band. Determination of the one or more frequencies that form the determined threshold frequency may be based on testing of the particular audio amplifier 104 and loudspeaker(s) 106 combination that have been paired. Such testing may be performed with instrumentation such as microphones, distortion analysis equipment, spectrum analyzers, and/or any other audio test and analysis equipment or functionality. The goal of such testing is to determine the threshold frequency or transition frequency band that produces an output impedance Zo(s) that minimizes distortion of the audible sound output by the loudspeaker 106 throughout the frequency range when driven by an audio signal. Such purposeful creation of output impedance goes against conventional designs of voltage amplifiers since the goal with voltage amplifiers is to have the lowest possible output impedance of the amplifier.

From the previous discussion it can be seen that desirable characteristics of the transfer function H(s) of the filter 120 used to synthesize the output impedance Zo(s) of the audio amplifier 104 include:

1. A well controlled but reduced gain below some chosen transition frequency or transition frequency band.
2. The phase of the LF region of the transfer function H(s) defined by the transition frequency may be such as to result in positive current feedback.
3. Most of the reduced gain area may be substantially constant in gain vs. frequency.
4. An increased gain above the chosen transition frequency band.
5. The phase of the HF region may be such as to result in negative current feedback.
6. There is no requirement for significant gain within the chosen transition frequency band.
7. Gain in the HF region can be small or large, but not so large as to render the closed-loop gainless.

The desirable characteristics of the transfer function H(s) of the filter may generally correspond to any of a number of the different filter designs that are hereafter described. In general, the following filter designs share a desired amplitude response similar to that of a shelving circuit (zero pole pair) or high-pass notch (notch depth not infinite), while also producing the desired phase inversion similar to that of a single-order all-pass filter without producing too much phase shift as in second order all-pass filters. It would be ideal to be able to control the width of the frequency band in which the filter transitions from inverting to non-inverting. First order all-pass filters have no control of the transition band's width. Second order all-pass filters can control the transition band's width but they return to the same phase as they began, being inverted only at the middle of the transition band.

Figure 2:
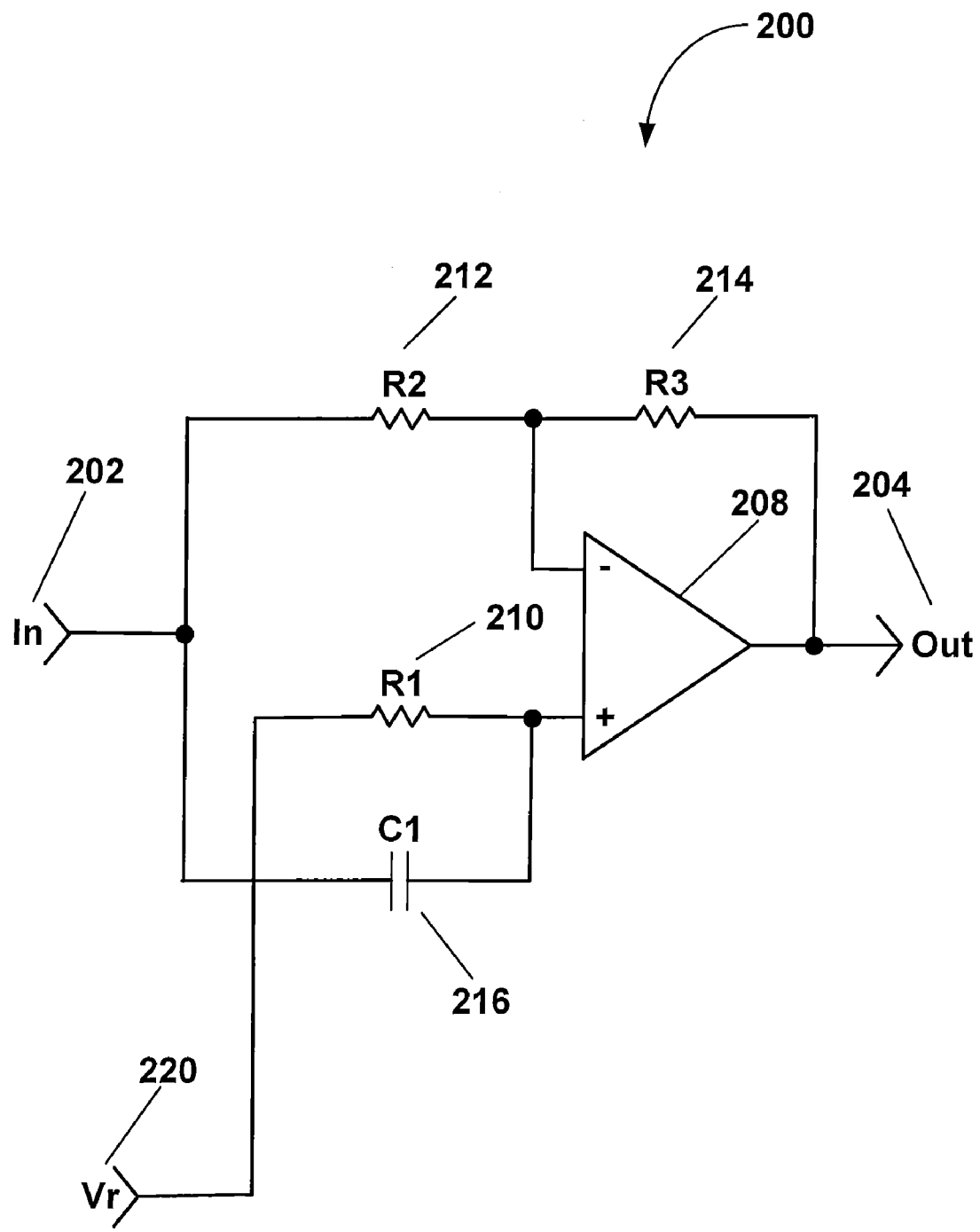
FIG. 2 is a circuit schematic of an example first order filter that can be included in the motional feedback system.

FIG. 2 is a circuit diagram of a first example of a filter 200 for use in the impedance control module 112 for a first particular loudspeaker 106 having a load impedance Z(s) that can be modeled by the transfer function H(s) of the filter 200. In FIG. 2, the filter 200 includes a filter input 202 to receive the sensed voltage V1(s) and a filter output 204 to provide the filtered voltage V2(s) to the summer 122 (FIG. 1). The filter 200 also includes a single op-amp 208, a first resistor R1 210, a second resistor R2 212, a third resistor R3 214, and a capacitor C1216 electrically connected as illustrated. A reference voltage Vr 220 is supplied from a power supply source. In the example of FIG. 2, the first resistor R1 210 may be 20 kohms, the second resistor R2 212 may be 20 kohms, the third resistor R3 214 may be 5 kohms, and the capacitor C1 216 may be 10 nanofarads. In other examples, other values of the components are possible to achieve similar functionality. The filter 200 is a first order filter that substantially meets the desirable characteristics by producing a non-flat response.

Figure 3:
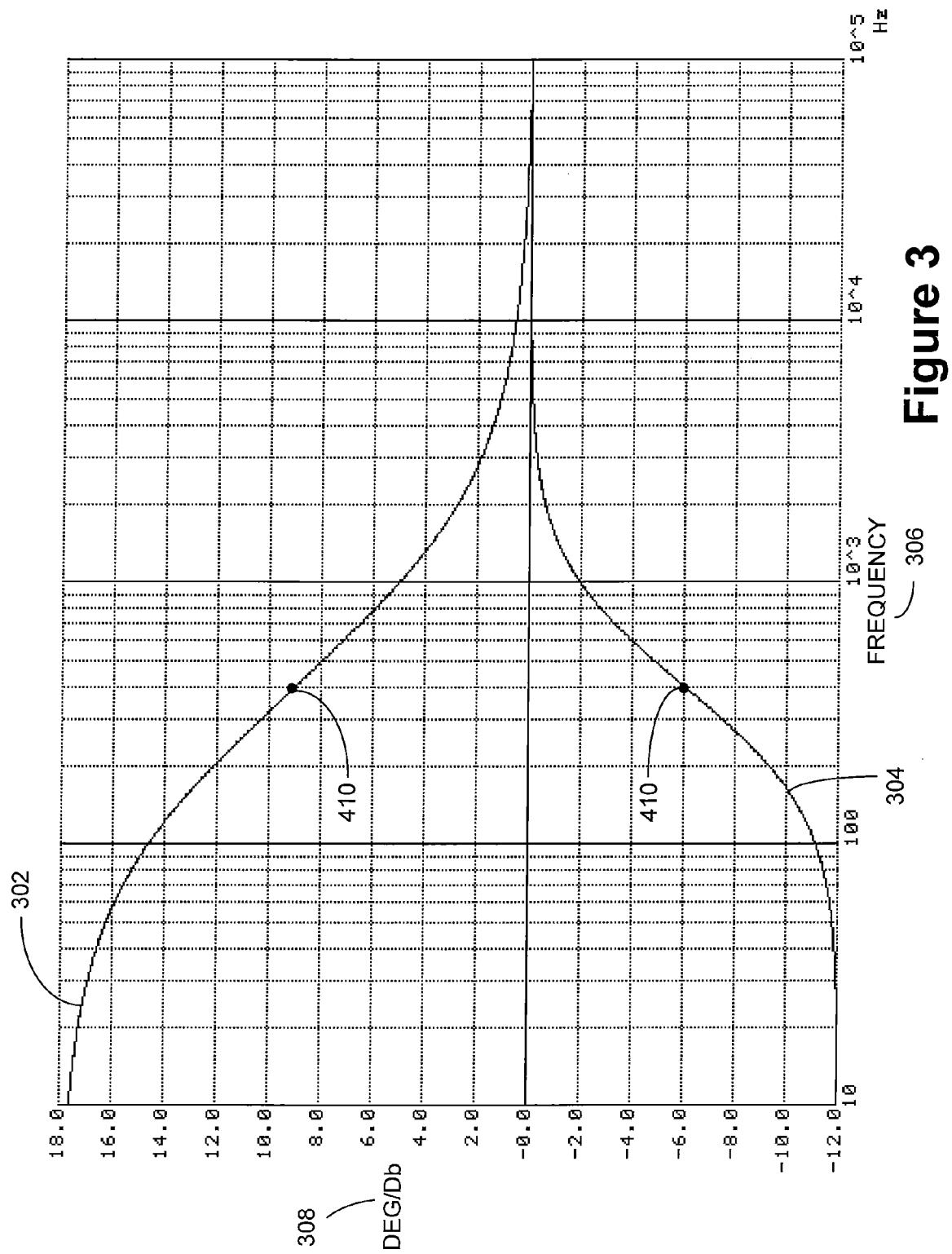
FIG. 3 is a magnitude and phase response of the filter of FIG. 2.

FIG. 3 is an example frequency range plot of a phase response 302 and a gain magnitude response 304 of the transfer function H(s) of the filter 200 of FIG. 2 depicted over a range of frequency 306 from 10 Hz to 100 kHz. The phase response 302 is provided in degrees 308 (divided by ten) over the range of frequency 306 such that the phase response is about 175 degrees at about 10 Hz. The gain magnitude response 304 is provided in decibels (dB) 308 over the range of frequency such that the gain is at about −12 dB at about 10 Hz.

Figure 4:
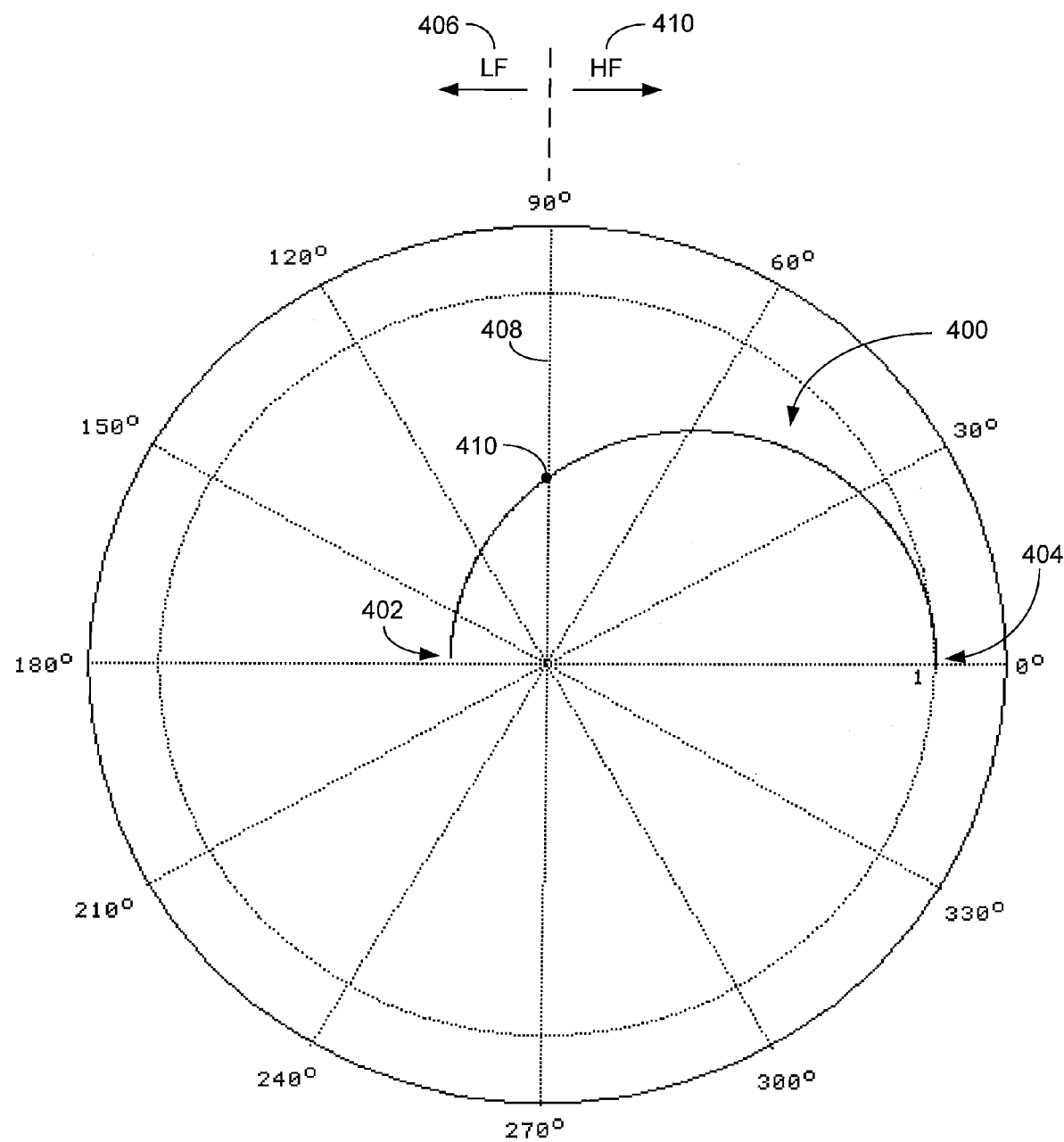
FIG. 4 is a complex plane display of the filter of FIG. 2.

FIG. 4 is a complex plane display of the transfer function H(s) of FIG. 2 shown as a Nyquist display that corresponds to the frequency range plot of FIG. 3. In FIG. 4, a curve 400 includes a first end 402 commencing at about 10 Hz and a second end 404 completing at about 100 KHz. The curve 400 in FIG. 4 is right turning with increasing frequency depicting a response trajectory of a stable causal system. In FIG. 4, an LF region 406 is to the left of a centerline 408 and is illustrative of the negative real and positive imaginary portion of an impedance vector representative of the impedance Z(s) being synthesized by the transfer function H(s) of the filter 200. An HF region 410 is to the right of the centerline 408 and is illustrative of a positive real and positive imaginary portion of the impedance vector representative of the impedance Z(s) being synthesized by the transfer function H(s) of the filter 200. The transition from negative feedback current to positive feedback current may occur at the center point 410. In FIG. 3, the phase 302 reaches ninety degrees at a frequency of about 400 Hz when the gain magnitude 304 is about −6 dB. Accordingly, with the transfer function H(s) of the filter 200 of FIG. 2, the transition frequency is about 400 Hz, and may be described as a transition frequency band substantially centered at about 400 Hz. Based on the positive feedback current, the output impedance of the amplifier 104 may be a negative impedance up to about 400 Hz, and then transition to a positive impedance above about 400 Hz based on the negative feedback current. In the LF region 406, the gain of the transfer function H(s) may range from about −12 dB at about 10 Hz to about −6 dB at about 400 Hz, whereas in the HF region, the gain may range from about −6.0 dB to about 0 dB. In FIG. 2, the gain within the LF region 406 is given as a negative result of resistor R3 214 divided by resistor R2 212 (−R3/R2) whereas the gain in the HF region 410 is substantially unity.

Figure 5:
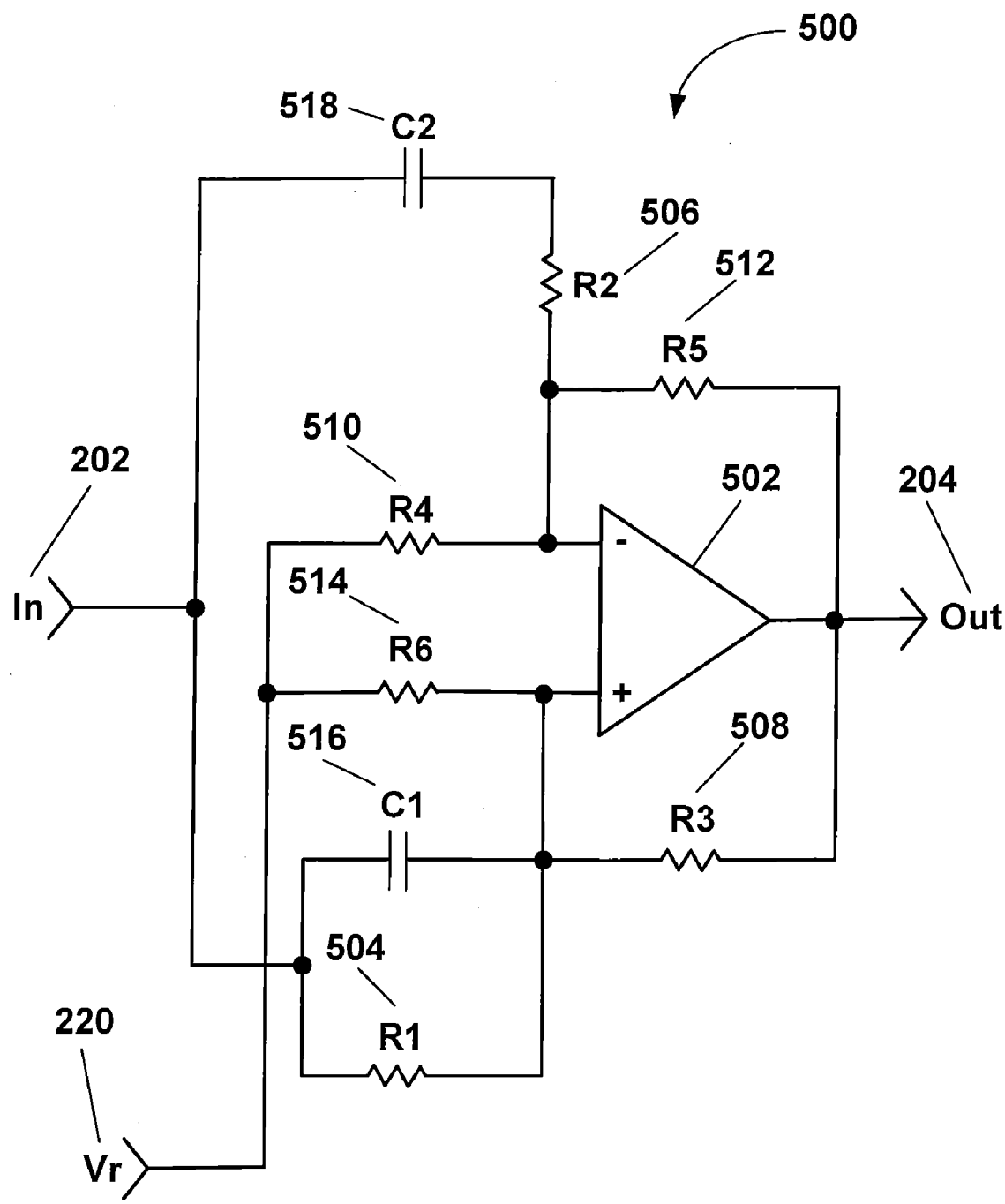
FIG. 5 is a circuit schematic of another example filter that can be included in the motional feedback system.

FIG. 5 is a circuit diagram of a second example of a filter 500 for use in the impedance control module 112 for a second particular loudspeaker 106 having a desired source impedance Z(s) that can be modeled by the transfer function H(s) of the filter 500. In FIG. 5, the filter 500 includes the filter input 202, the filter output 204, and receives the reference voltage Vr 220. The filter 500 also includes a single op-amp 502, a first resistor R1 504, a second resistor R2 506, a third resistor R3 508, a fourth resistor R4 510, a fifth resistor R5 512, a sixth resistor R6 514, a first capacitor C1 516 and a second capacitor C2 518 electrically connected as illustrated. The filter 500 is similar to a high pass notch circuit in that it can be tailored to produce the appropriate magnitudes of gain for general shelving but with the additional desirable characteristic of being capable of producing a single inversion between the LF region and the HF region. In the example of FIG. 5, the first resistor R1 504 may be 20 kohms, the second resistor R2 506 may be 10 kohms, the third resistor R3 508 may be 40 kohms, the fourth resistor R4 510 may be 13.3 kohms, the fifth resistor R5 512 may be 40 kohms, the sixth resistor R6 514 may be 8 kohms, and the first and second capacitors C1 216 and C2 218 may each be 10 nanofarads. In other examples, other values of the components are possible to achieve similar functionality.

Figure 6:
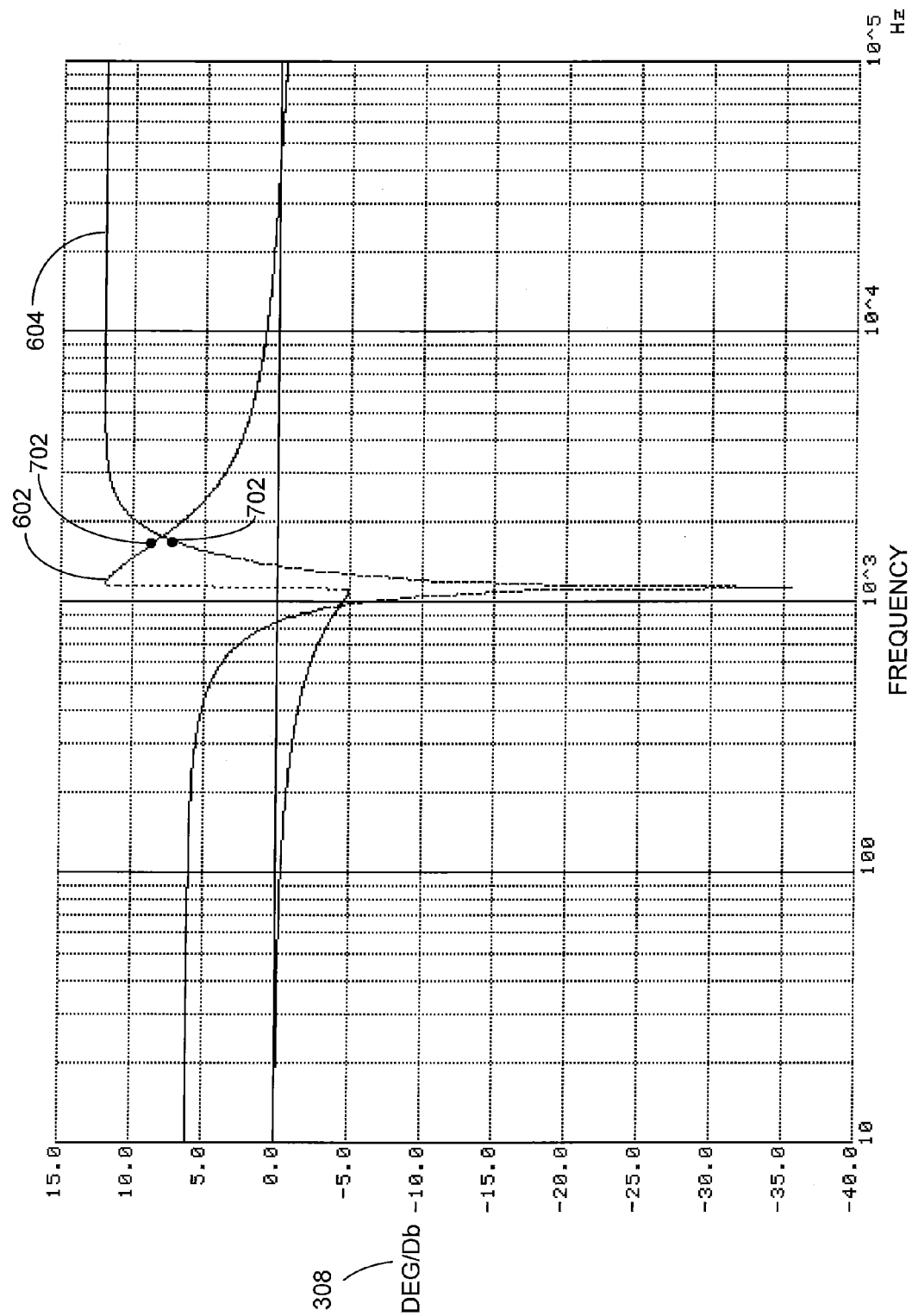
FIG. 6 is a magnitude and phase response of the filter of FIG. 5.

FIG. 6 is an example frequency range plot of a phase response 602 and a gain magnitude response 604 of the transfer function H(s) of the filter 500 of FIG. 5 depicted over a range of frequency 306 from 10 Hz to 100 kHz. The phase response 602 is provided in degrees 308 (divided by ten) over the range of frequency 306 such that the phase response is about 0 degrees at about 20 Hz. The gain magnitude response 604 is provided in decibels (dB) 308 over the range of frequency such that the gain is at about 6 dB at about 10 Hz.

Figure 7:
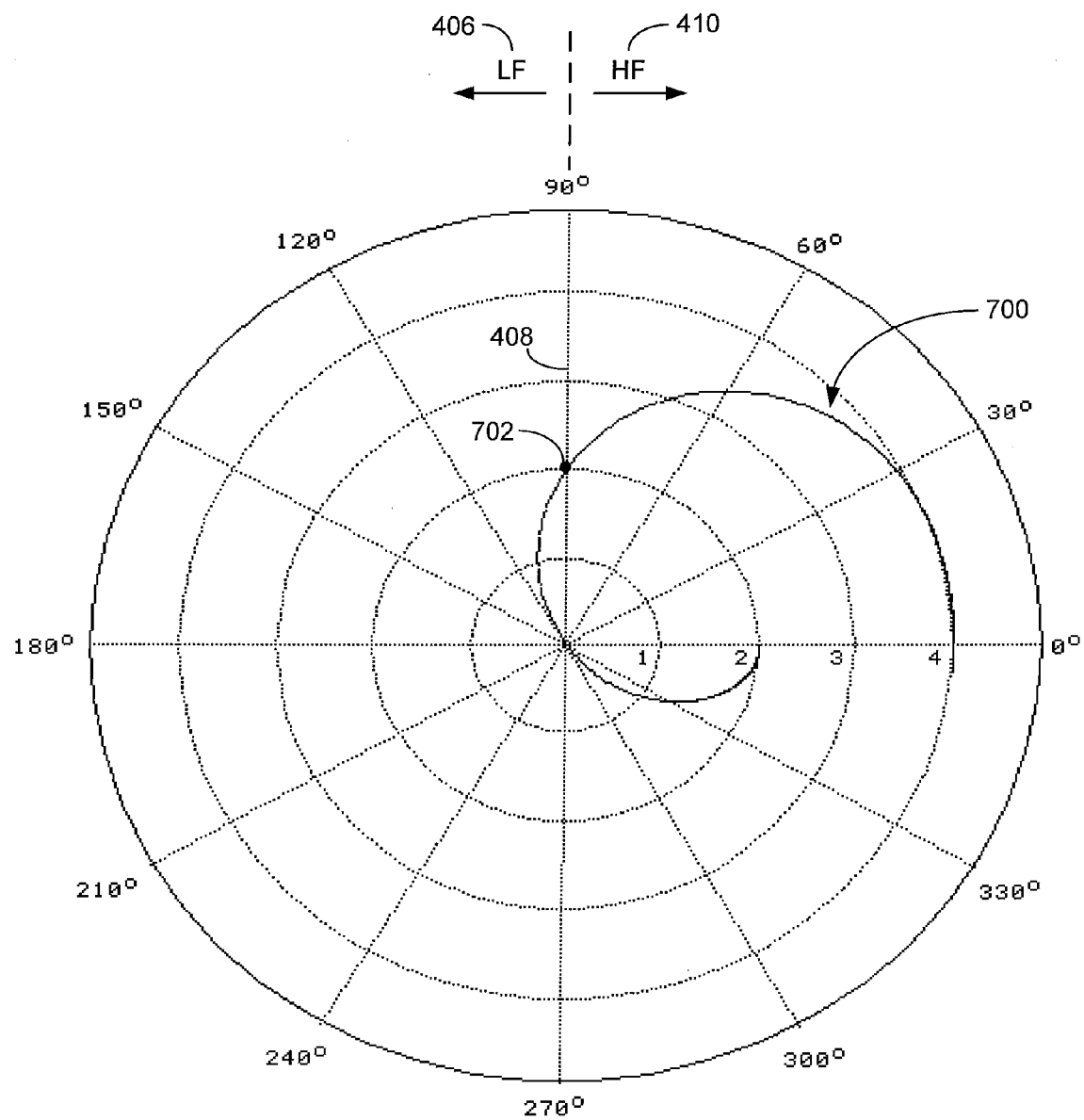
FIG. 7 is a complex plane display of the filter of FIG. 5.

FIG. 7 is a complex plane display of the transfer function H(s) of FIG. 5 shown as another Nyquist display that corresponds to the frequency range plot of FIG. 6. In FIG. 7, a curve 700 commences at about 10 Hz and completes at about 100 KHz and is right turning with increasing frequency depicting a response trajectory of a stable causal system, similar to FIG. 4. In FIG. 7, the transition from negative feedback current in the LF region 406 to positive feedback current in the HF region 410 occurs at a center point 702. In FIG. 6, the phase 602 reaches ninety degrees at a frequency of about 1800 Hz when the gain magnitude 604 is about +7 dB. Accordingly, with the transfer function H(s) of the filter 500 of FIG. 5, the transition frequency is about 1500 Hz, or a transition frequency band substantially centered at about 1500 Hz. Based on the negative feedback current, the output impedance of the amplifier 104 may be a negative impedance up to about 1500 Hz, and then transition to a positive impedance above 1500 Hz based on the positive feedback current. In the LF region 406, the gain of the transfer function H(s) may range from about −27 dB at about 1100 Hz to about 6 dB at between about 10 Hz and 200 Hz, whereas in the HF region, the gain may range from about +6 dB to about 12 dB.

With this filter design there is one inversion which may occur abruptly as the gain passes through zero but an additional inversion occurs diffusely over the whole spectrum. In general for the filter 500, the low frequency response can start on the real axis on either side of the origin but it will always end on the same side of the origin as which it began (both axes mirrored). It is possible to shift the curve 700 of FIG. 7 toward the LF region 406, but that may tend to result in a curve whose magnitude of negative impedance (resistance R) grows as frequency increases. To avoid instability, the particular loudspeaker 106 being paired with the amplifier 104 should have a similar growth in positive impedance (resistance R) as frequency increases.

Figure 8:
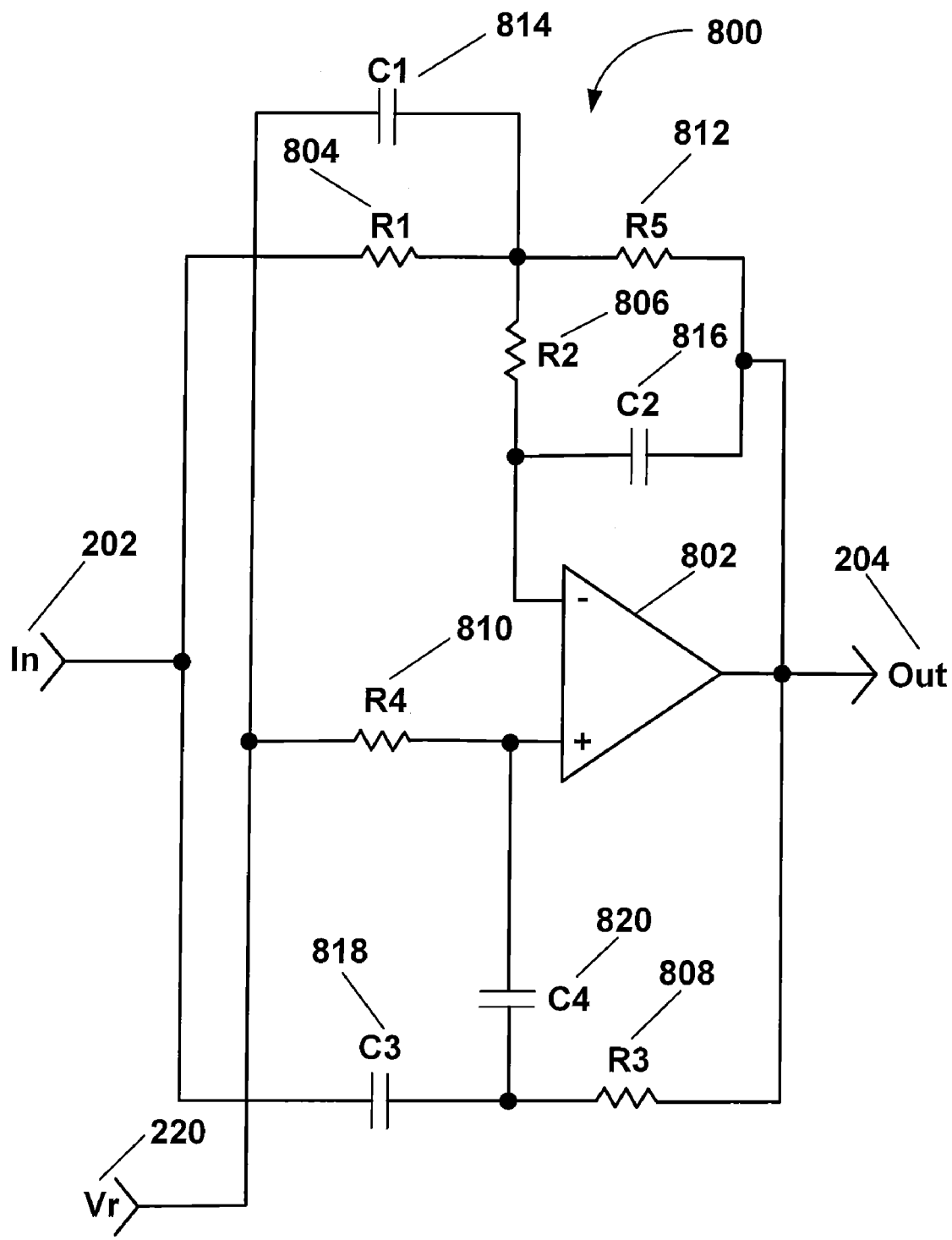
FIG. 8 is a circuit schematic of another example filter that can be included in the motional feedback system.

FIG. 8 is a circuit diagram of a third example of a filter 800 for use in the impedance control module 112 for a third particular loudspeaker 106 having a load impedance Z(s) that can be modeled by the transfer function H(s) of the filter 800. In FIG. 8, the filter 800 includes the filter input 202, the filter output 204, and receives the reference voltage Vr 220. The filter 800 also includes a single op-amp 802, a first resistor R1 804, a second resistor R2 806, a third resistor R3 808, a fourth resistor R4 810, a fifth resistor R5 812, a first capacitor C1 814, a second capacitor C2 816, a third capacitor C3 818 and a fourth capacitor C4 820 electrically connected as illustrated.

The filter 800 is a composite filter that produces a transfer function similar in some respects to the sum of a second order inverting low-pass and a second order non-inverting high-pass. All this is done with one op-amp 802. The response of this filter 800 allows a more rapid frequency transition between the positive and negative current feedback realms (between the LF region and the HF region). In the example of FIG. 8, the first resistor R1 804 may be 20 kohms, the second resistor R2 806 may be 150 kohms, the third resistor R3 808 may be 15 kohms, the fourth resistor R4 810 may be 40 kohms, the fifth resistor R5 812 may be 5 kohms and the first, second, third, and fourth capacitors C1 814, C2 816, C3 818, and C4 820 may each be 10 nanofarads. In other examples, other values of the components are possible to achieve similar functionality.

Figure 9:
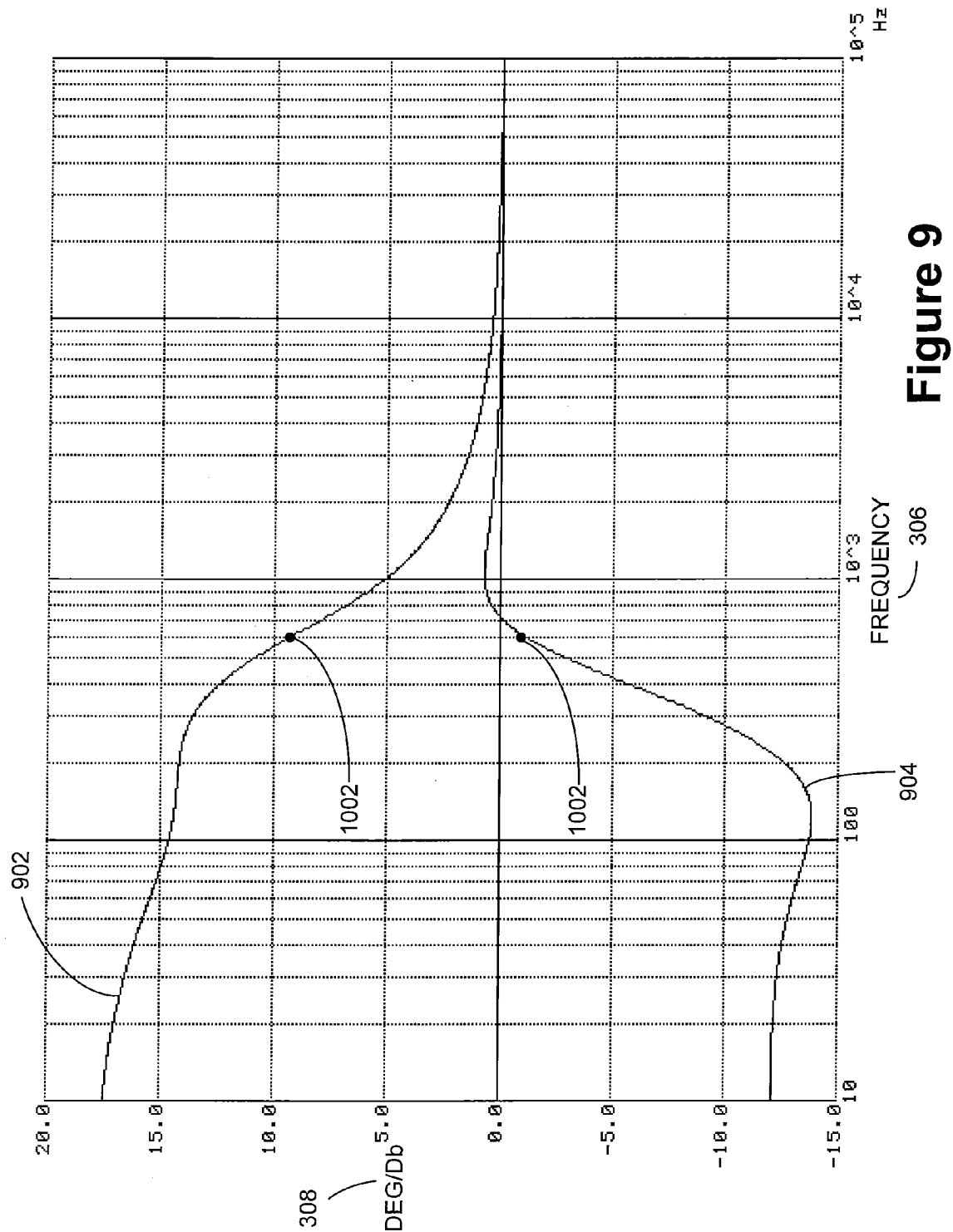
FIG. 9 is a magnitude and phase response of the filter of FIG. 8.

FIG. 9 is an example frequency range plot of a phase response 902 and a gain magnitude response 904 of the transfer function H(s) of the filter 800 of FIG. 8 depicted over a range of frequency 306 from 10 Hz to 100 kHz. The phase response 802 is provided in degrees 308 (divided by ten) over the range of frequency 306 such that the phase response is about 175 degrees at about 10 Hz. The gain magnitude response 904 is provided in decibels (dB) 308 over the range of frequency such that the gain is at about −12 dB at about 10 Hz.

Figure 10:
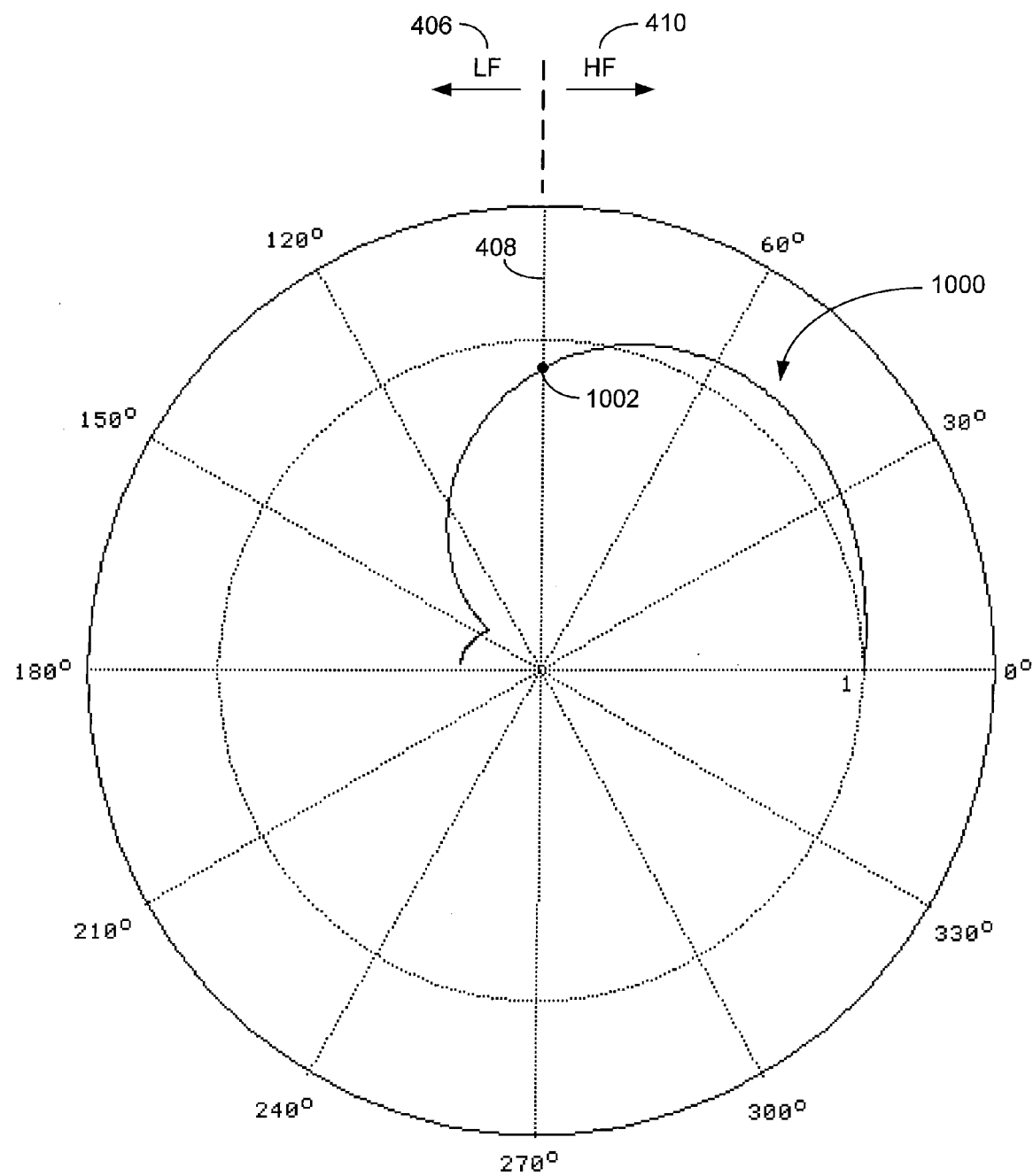
FIG. 10 is a complex plane display of the filter of FIG. 8.

FIG. 10 is a complex plane display of the transfer function H(s) of FIG. 8 shown as another Nyquist display that corresponds to the frequency range plot of FIG. 9. In FIG. 10, a curve 1000 commences at about 10 Hz and completes at about 100 KHz and is right turning with increasing frequency depicting a response trajectory of a stable causal system, similar to FIGS. 4 and 7. In FIG. 10, the transition from negative feedback current in the LF region 406 to positive feedback current in the HF region 410 occurs at a center point 1002. In FIG. 9, the phase 902 reaches ninety degrees at a frequency of about 600 Hz when the gain magnitude 904 is about −1 dB. Accordingly, with the transfer function H(s) of the filter 800 of FIG. 8, the transition frequency is about 600 Hz, or a transition frequency band substantially centered at about 600 Hz. Based on the positive feedback current, the output impedance of the amplifier 104 may be a negative impedance up to about 600 Hz, and then transition to a positive impedance above 600 Hz based on the negative feedback current. In the LF region 406, the gain of the transfer function H(s) may range from about −14 dB at about 150 Hz to about −1 dB at about 600 Hz, whereas in the HF region 410, the gain may range from about −1 dB to about 1 dB over the frequency range.

Figure 11:
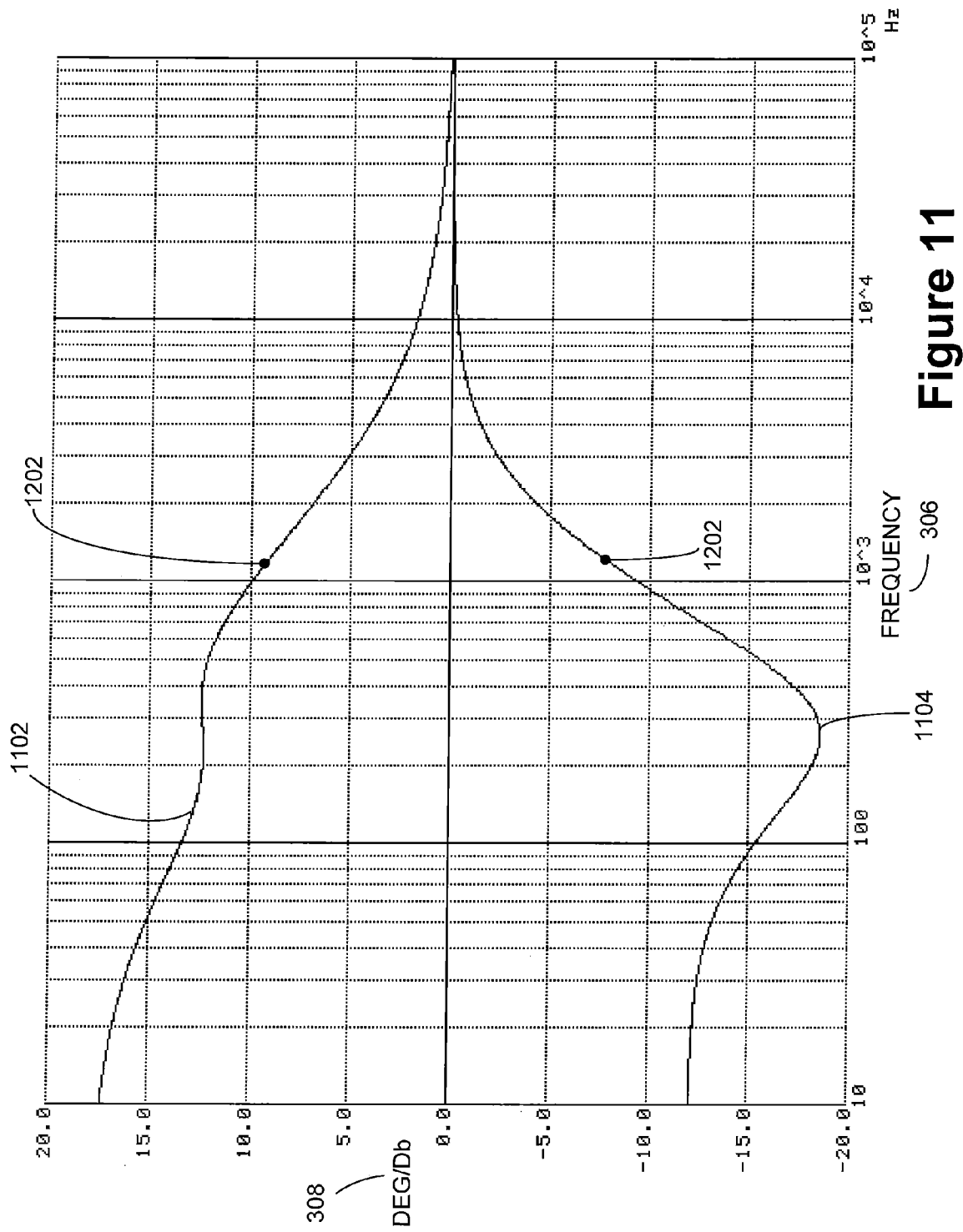
FIG. 11 is a magnitude and phase response of the filter of FIG. 8 with a different set of component values than is discussed with reference to FIG. 9.
Figure 12:
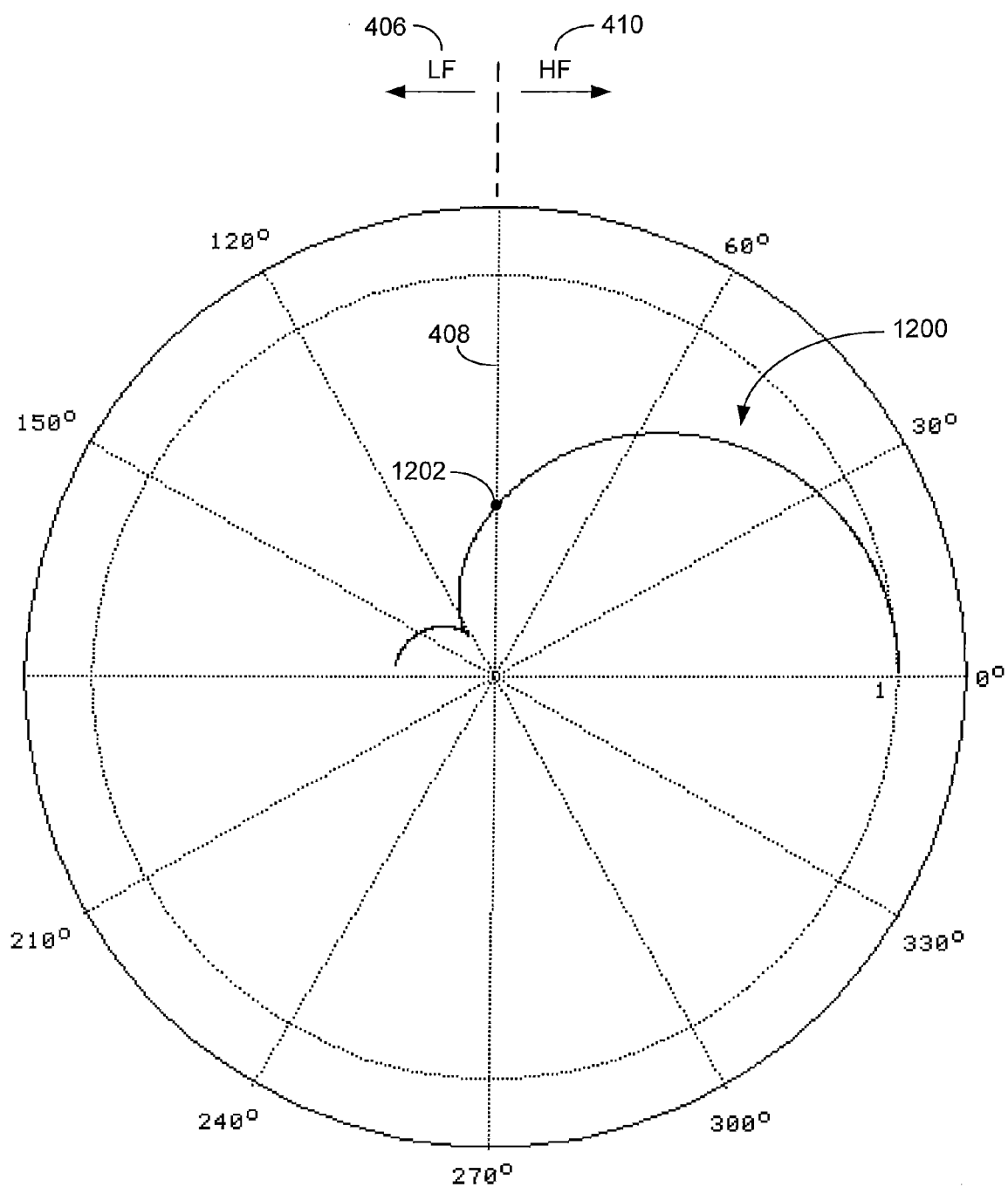
FIG. 12 is a complex plane display of the filter of FIG. 8 with a different set of component values than is discussed with reference to FIG. 10.

If the filter 800 is appropriately tuned, it is possible to create a loop in the response which descends towards a null similar to the filter 500 of FIG. 5, but in this design the phase does not jump through the origin. For example, the fourth resistor R4 810 of FIG. 8 may be reduced in value from 40 kohms to 10 kohms to achieve this effect. FIG. 11 is another example frequency range plot of a phase response 1102 and a gain magnitude response 1104 of the transfer function H(s) of the filter 800 of FIG. 8 with the fourth resistor R4 810 at 10 kohms. FIG. 12 is a complex plane display of the transfer function H(s) of FIG. 8 with the fourth resistor R4 810 at 10 kohms that corresponds to the frequency range plot of FIG. 11. In FIG. 12, similar to FIG. 10, a curve 1200 is right turning with increasing frequency depicting a response trajectory of a stable causal system, and has a transition frequency at a point 1202 of about 1100 Hz. One difference between the tuning of the filter 800 in FIGS. 11-12 and the filter 800 of FIGS. 9-10 is that the transition between the LF region 406 and HF region 410 is now slower. The circuit is obviously quite flexible and can be tailored as needed.

In other examples, higher order single op-amp inverting low pass (LP) and non-inverting high pass (HP) filters 120 are possible. Some examples may include use of a more complex topology such as multiple op-amps, and/or higher order configurations. Any investigation of additional filter designs for the filter 120 are best made in conjunction with closed loop stability models with the load impedance of the loudspeaker to which the amplifier 104 will be paired fully represented in the models.

Figure 13:
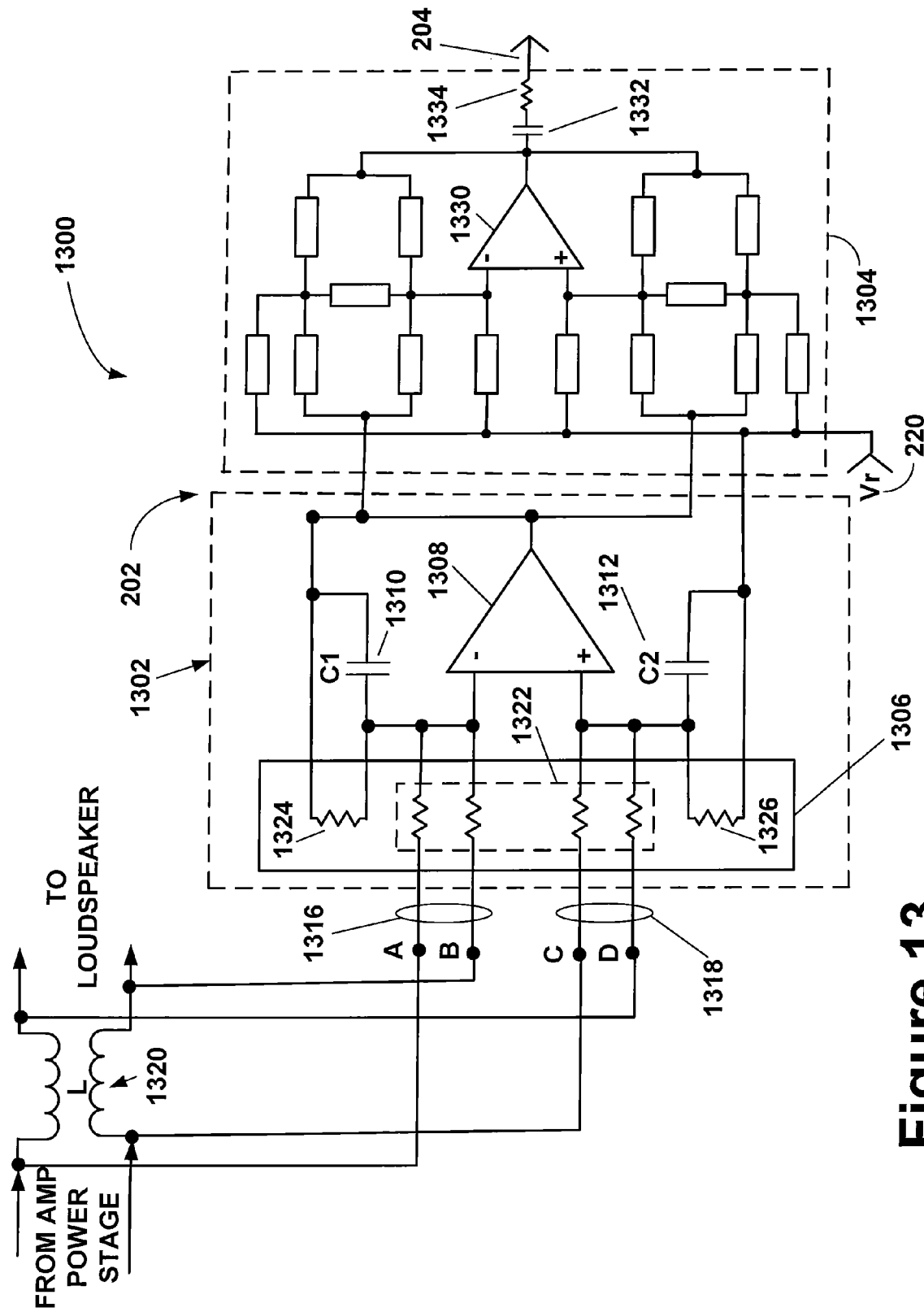
FIG. 13 is a circuit schematic of a portion of an example motional feedback system that includes a current sensor and a filter.
Figure 14:
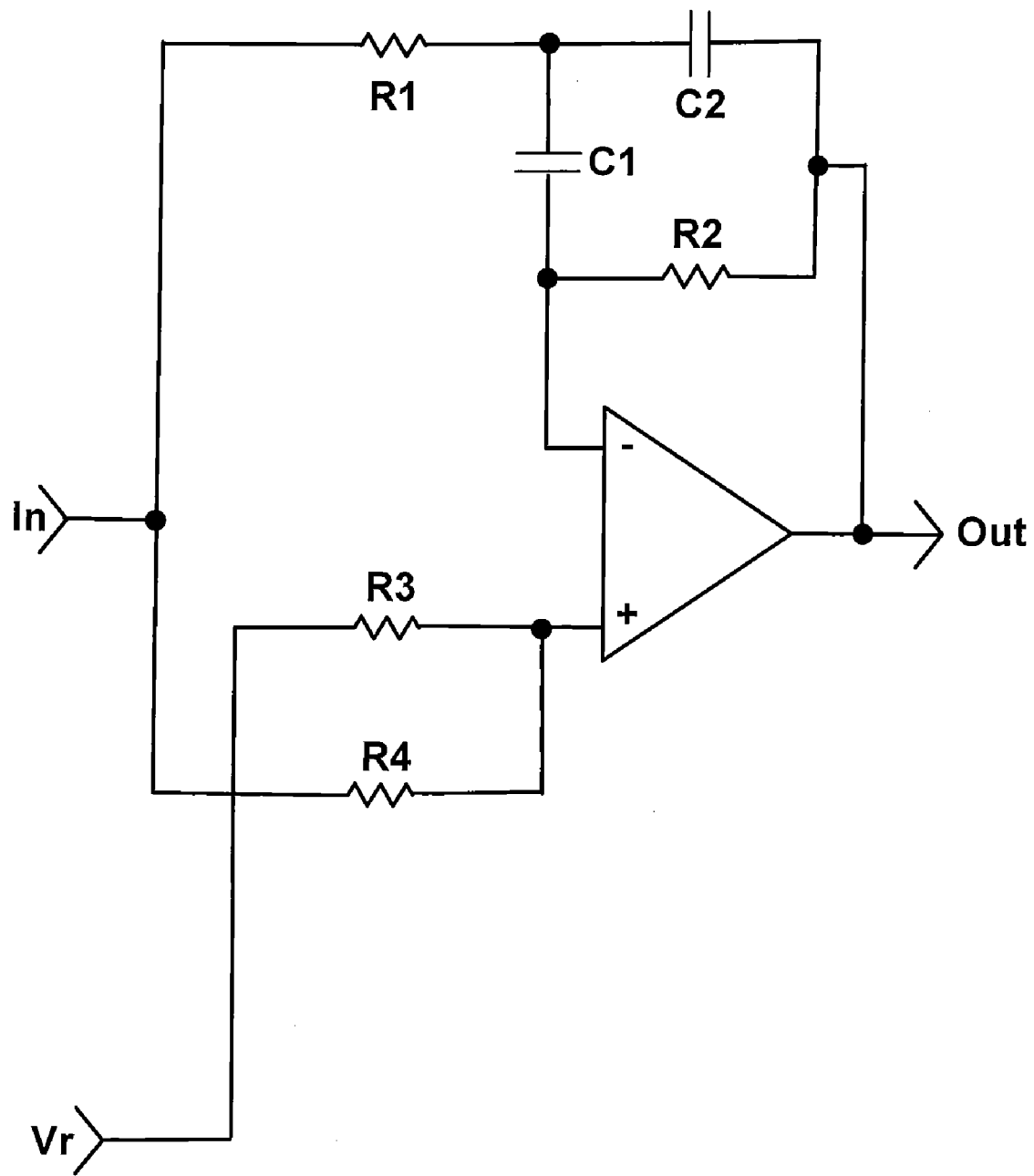
FIG. 14 is a circuit schematic of an example second order filter having characteristics similar to an all pass, band reject or band pass filter that can be included in the motional feedback system.
Figure 15:
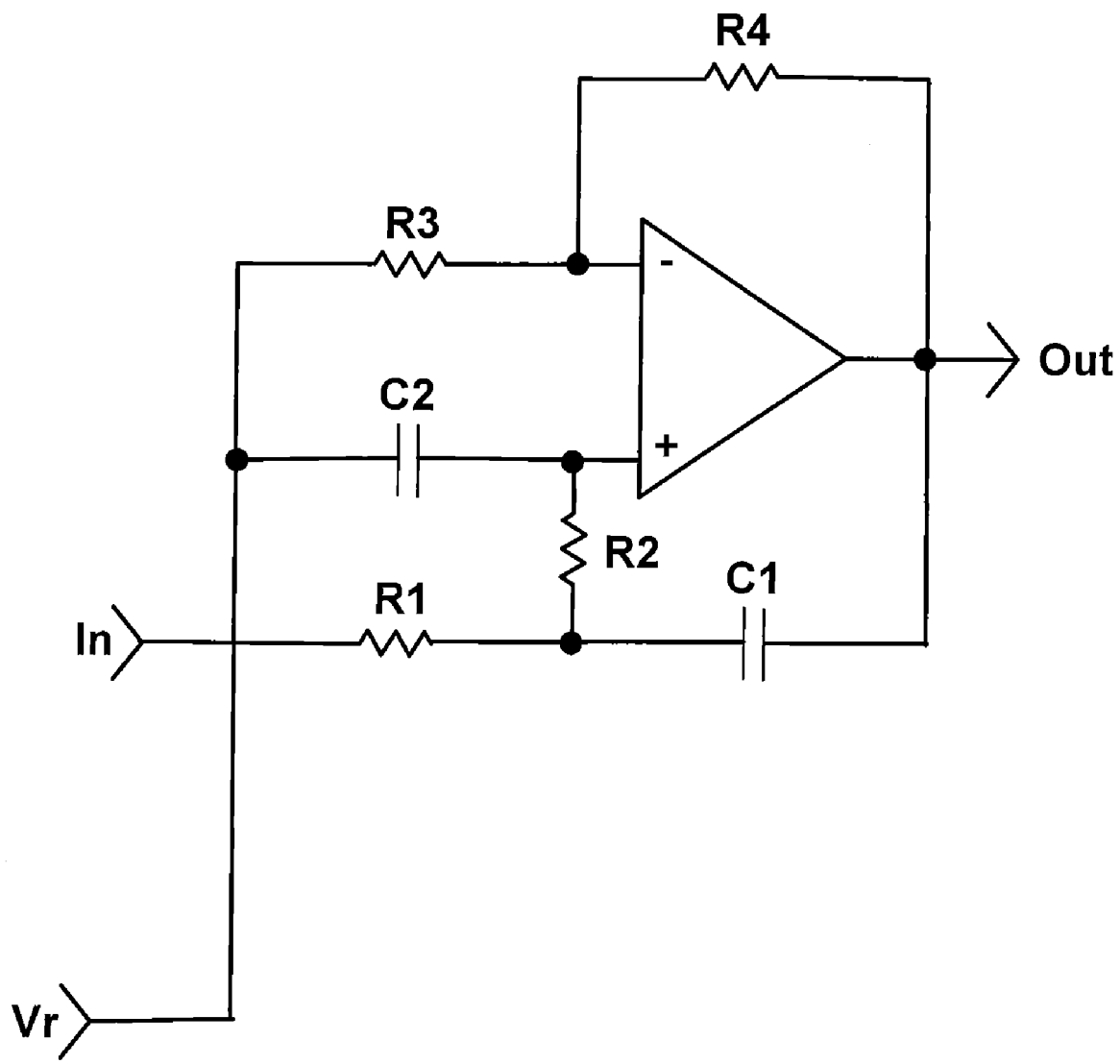
FIG. 15 is a circuit schematic of another example second order filter having characteristics similar to a low pass filter that can be included in the motional feedback system.
Figure 16:
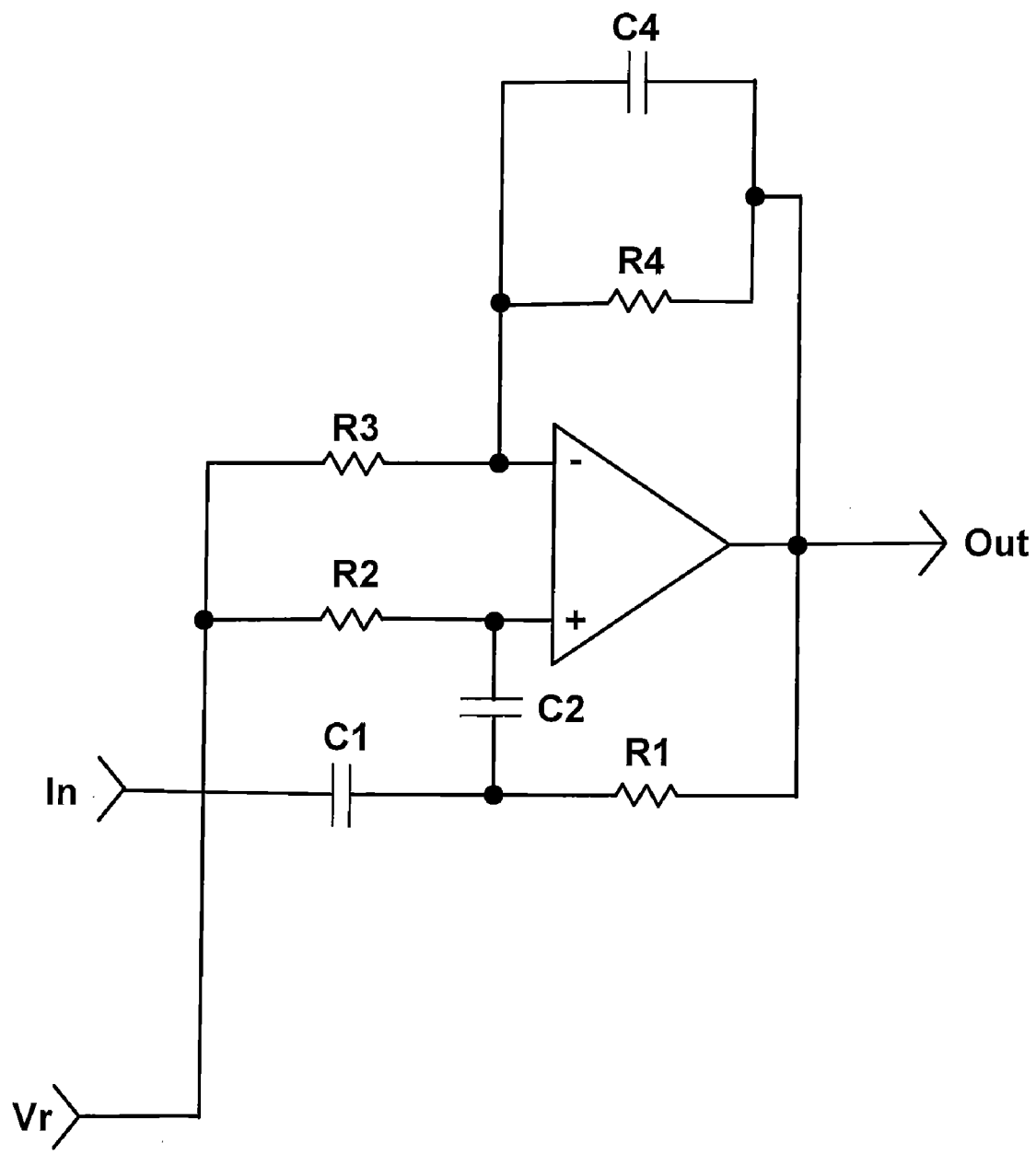
FIG. 16 is a circuit schematic of still another example second order filter having characteristics similar to a high pass filter that can be included in the motional feedback system.
Figure 17:
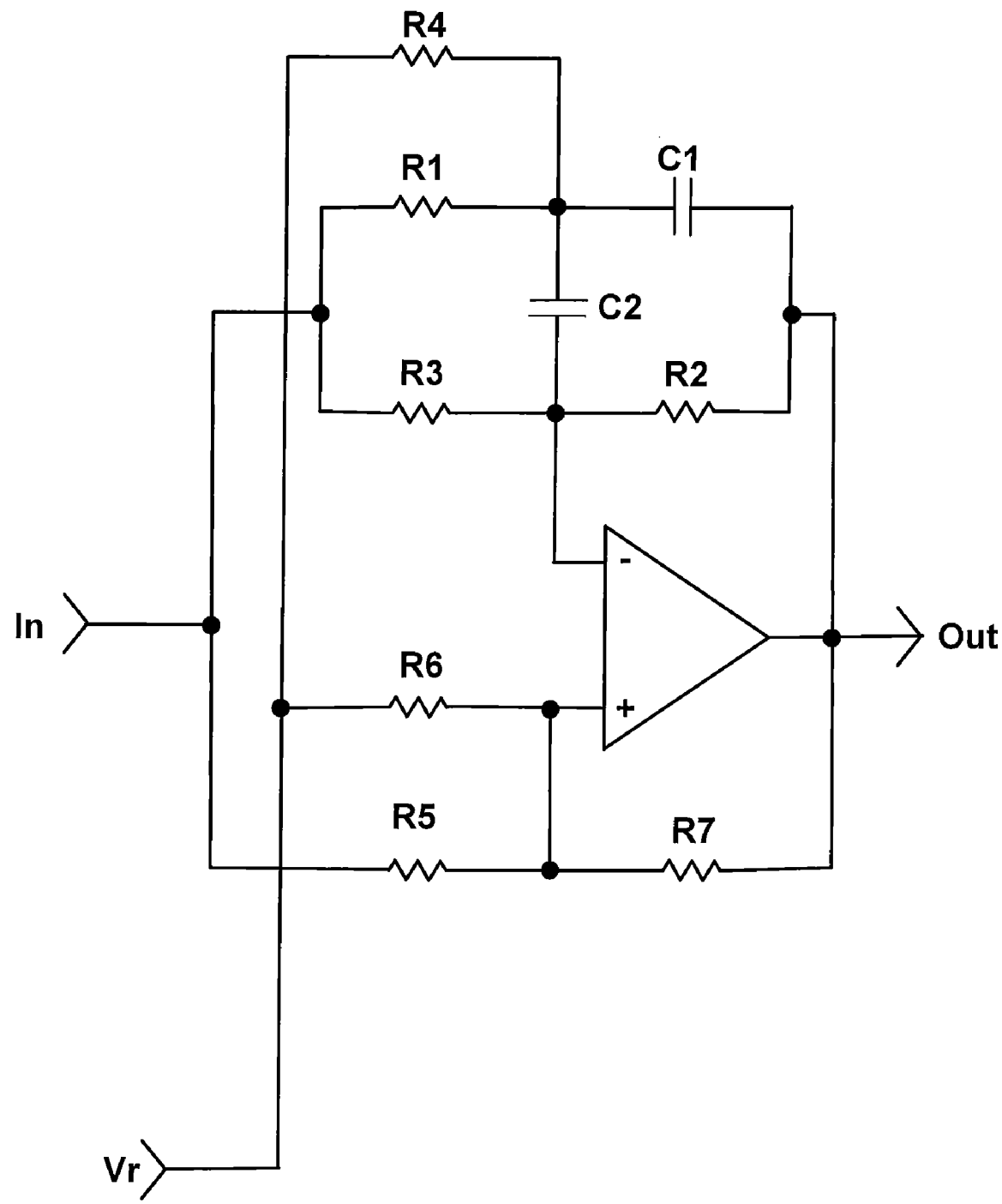
FIG. 17 is a circuit schematic of yet another example filter having characteristics similar to a high pass filter that can be included in the motional feedback system.
Figure 18:
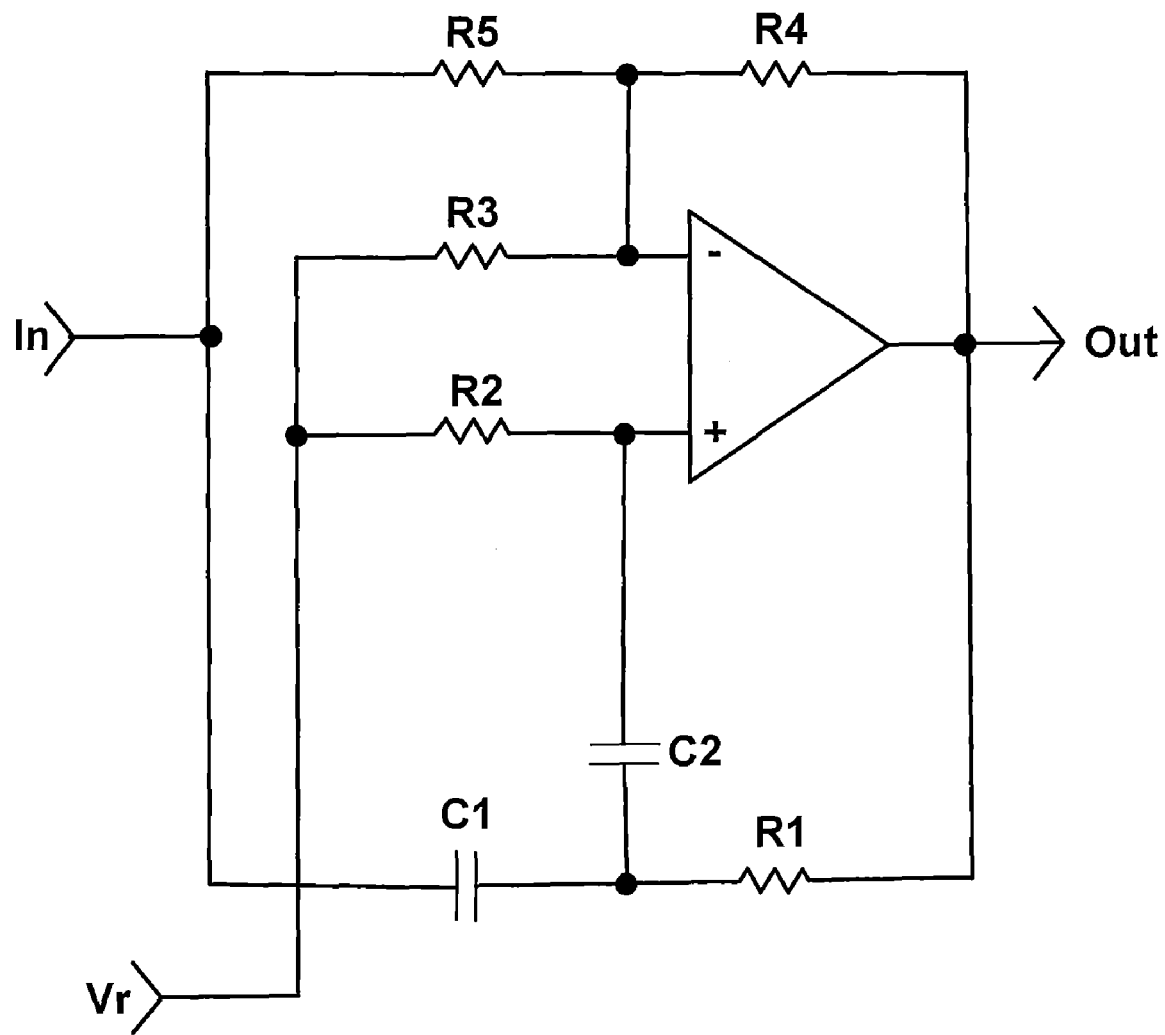
FIG. 18 is a circuit schematic of still another example filter having characteristics similar to a high pass notch filter that can be included in the motional feedback system.
Figure 19:
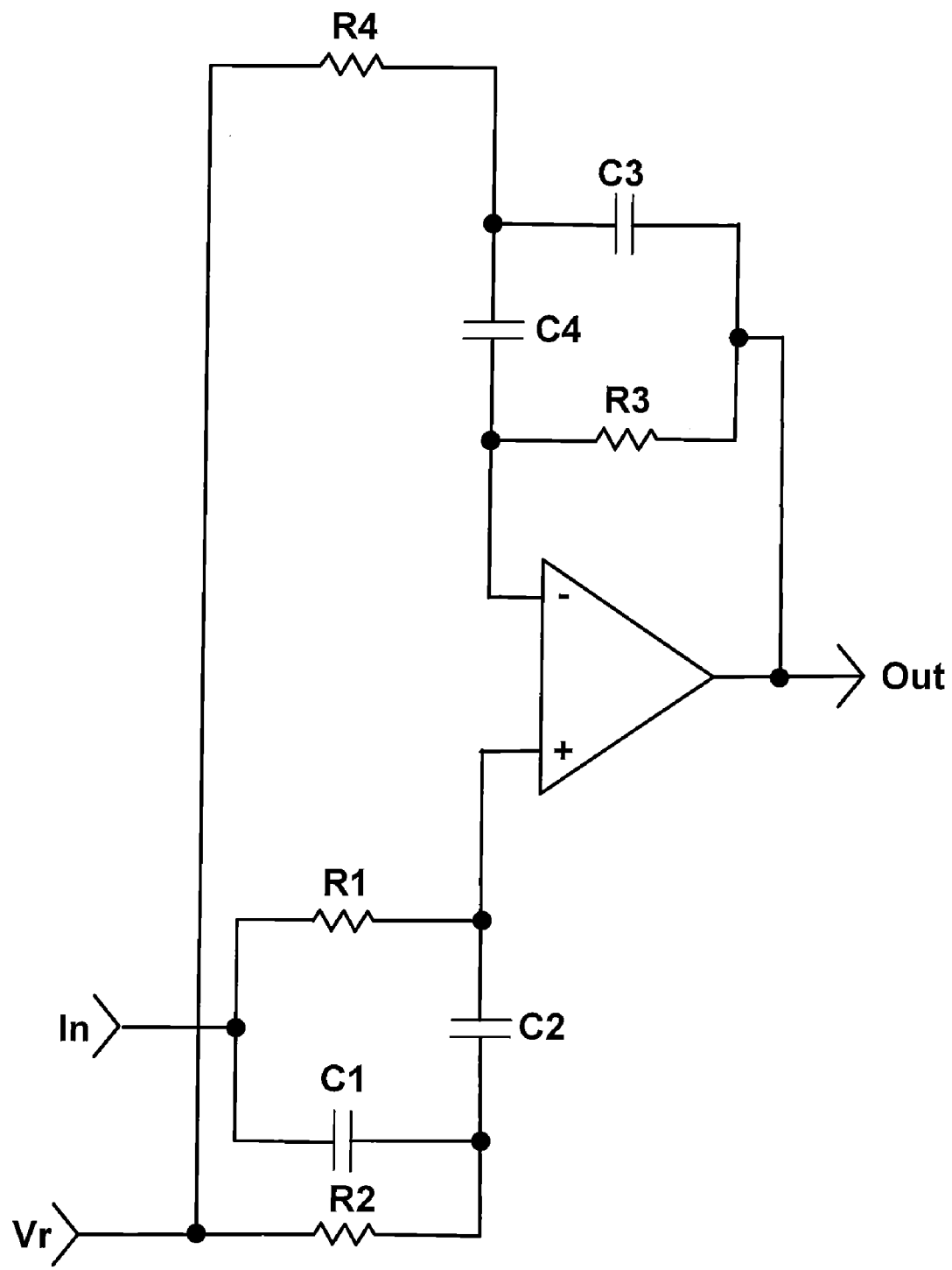
FIG. 19 is a circuit schematic of an example filter having characteristics similar to bump and dip equalization that can be included in the motional feedback system.
Figure 20:
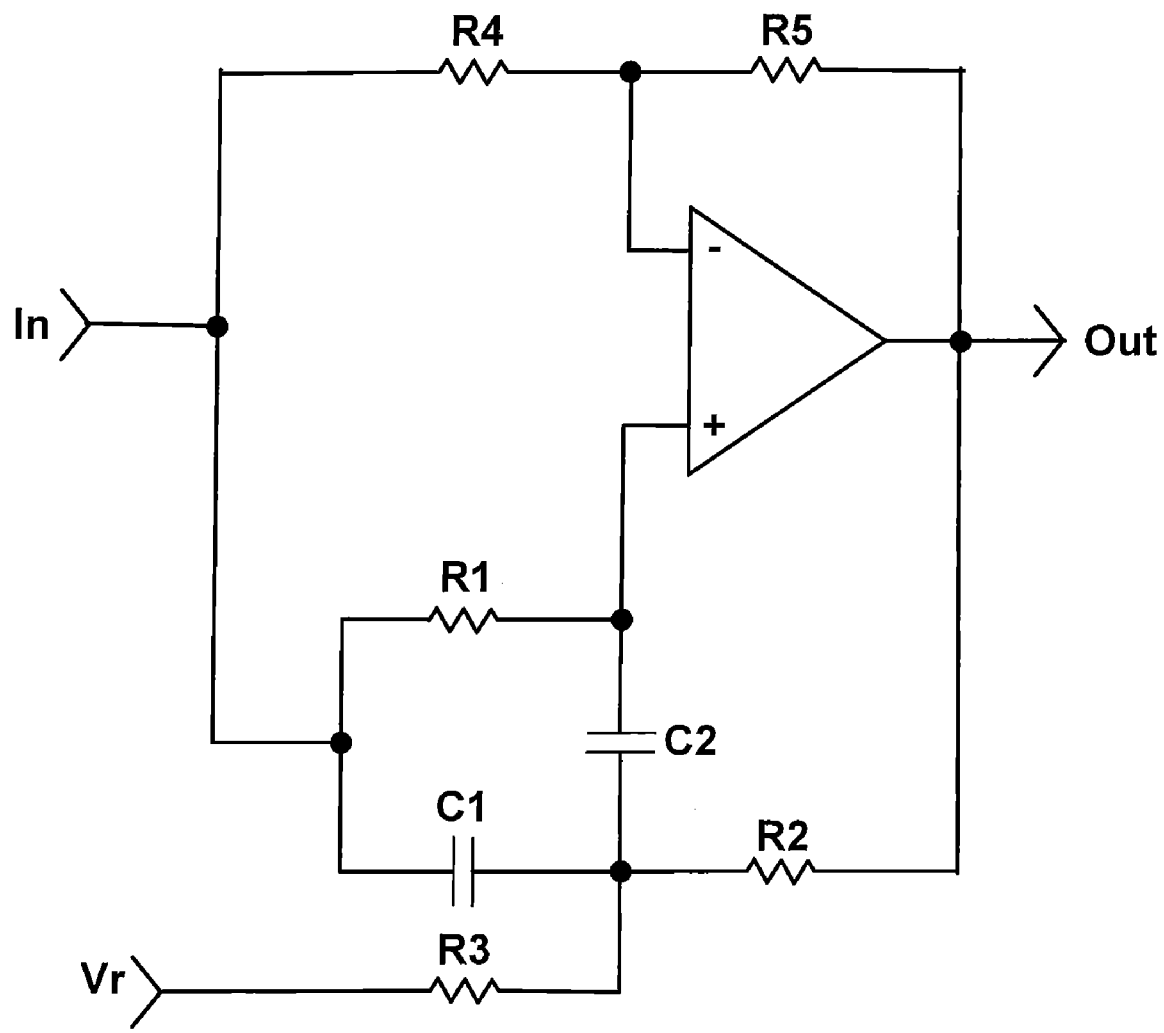
FIG. 20 is a circuit schematic of yet another example second order filter having characteristics similar to an all pass filter or a minimum phase filter that can be included in the motional feedback system.
Figure 21:
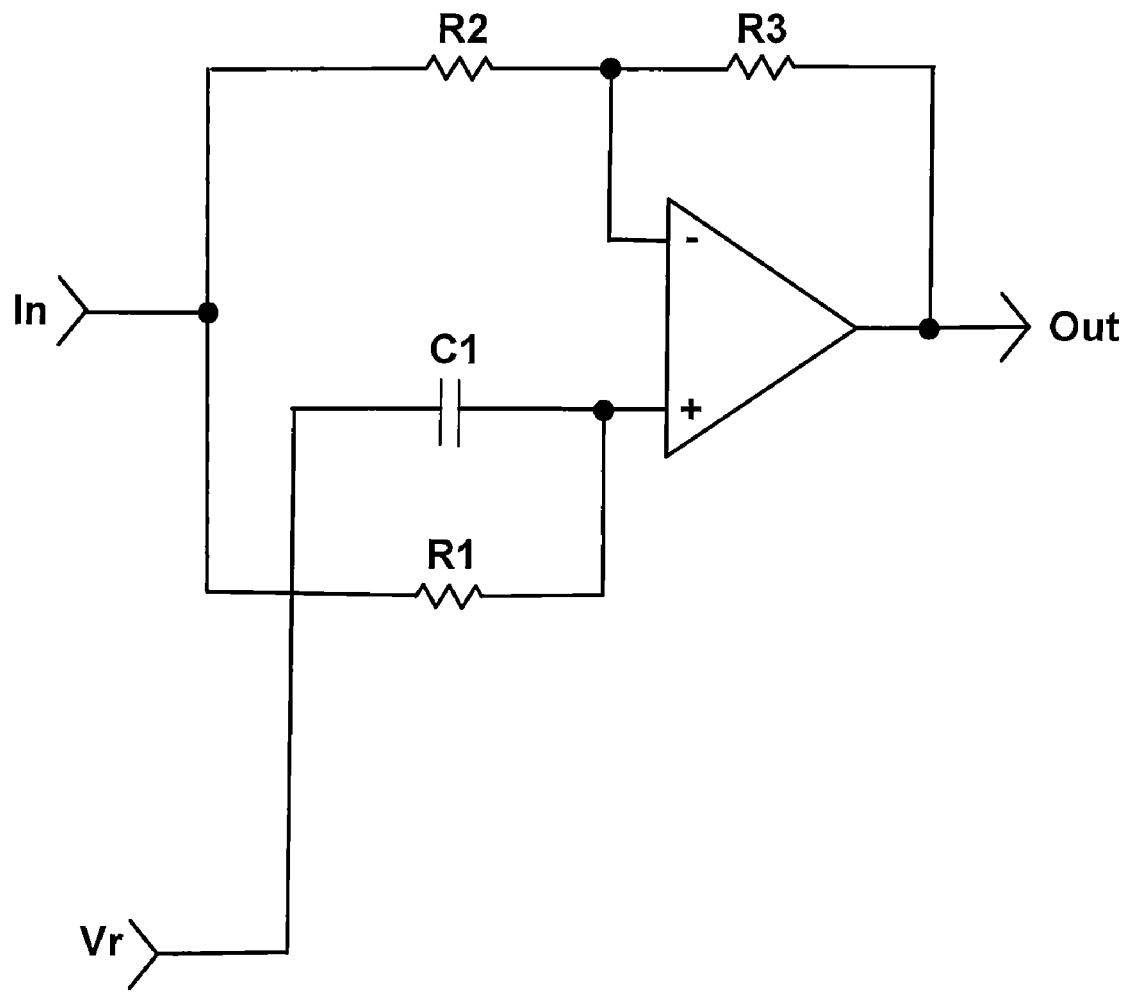
FIG. 21 is a circuit schematic of yet another example first order filter having characteristics similar to an all pass filter that can be included in the motional feedback system.
Figure 22:
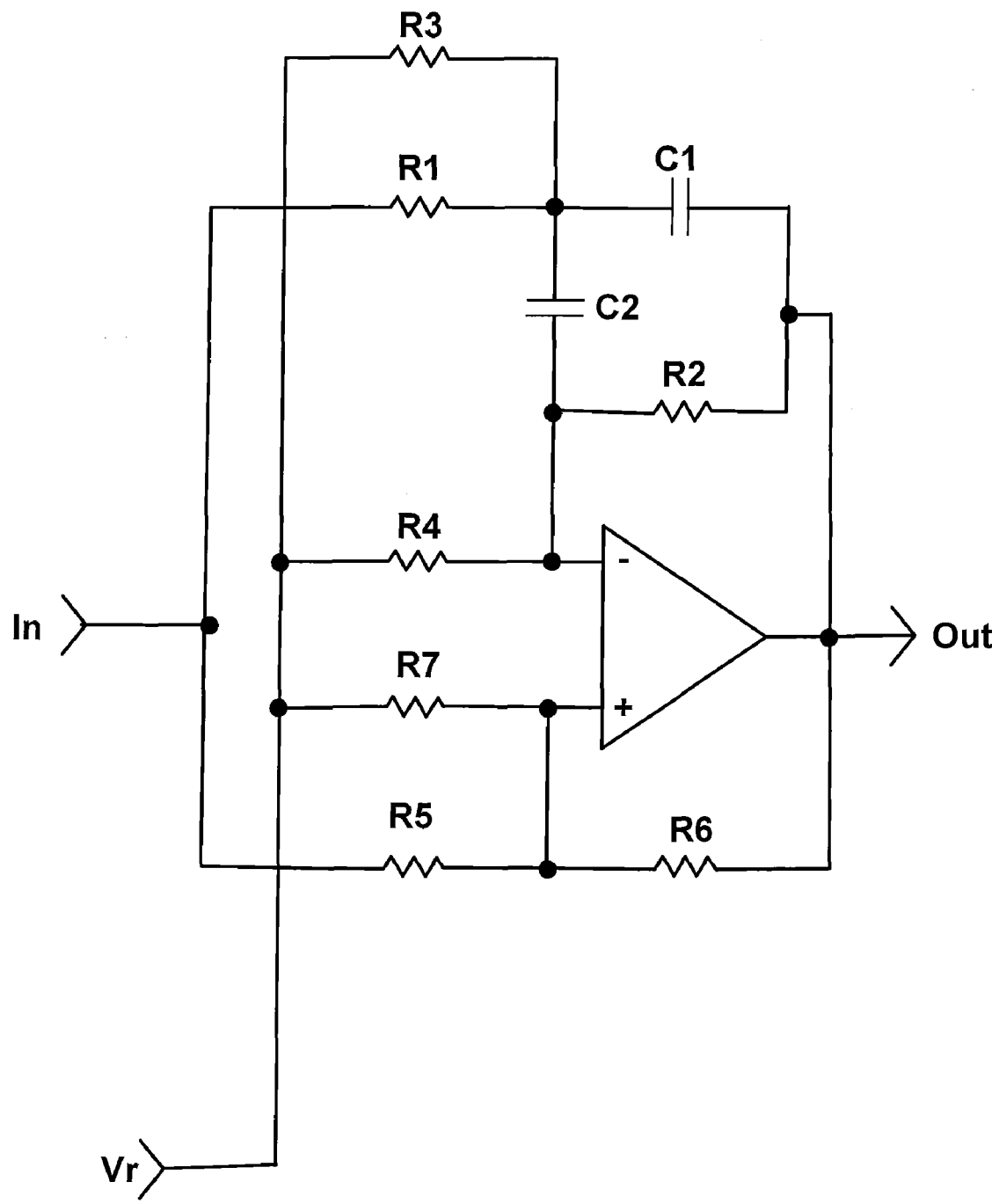
FIG. 22 is a circuit schematic of yet another example filter having characteristics similar to a low pass notch filter that can be included in the motional feedback system.
Figure 23:
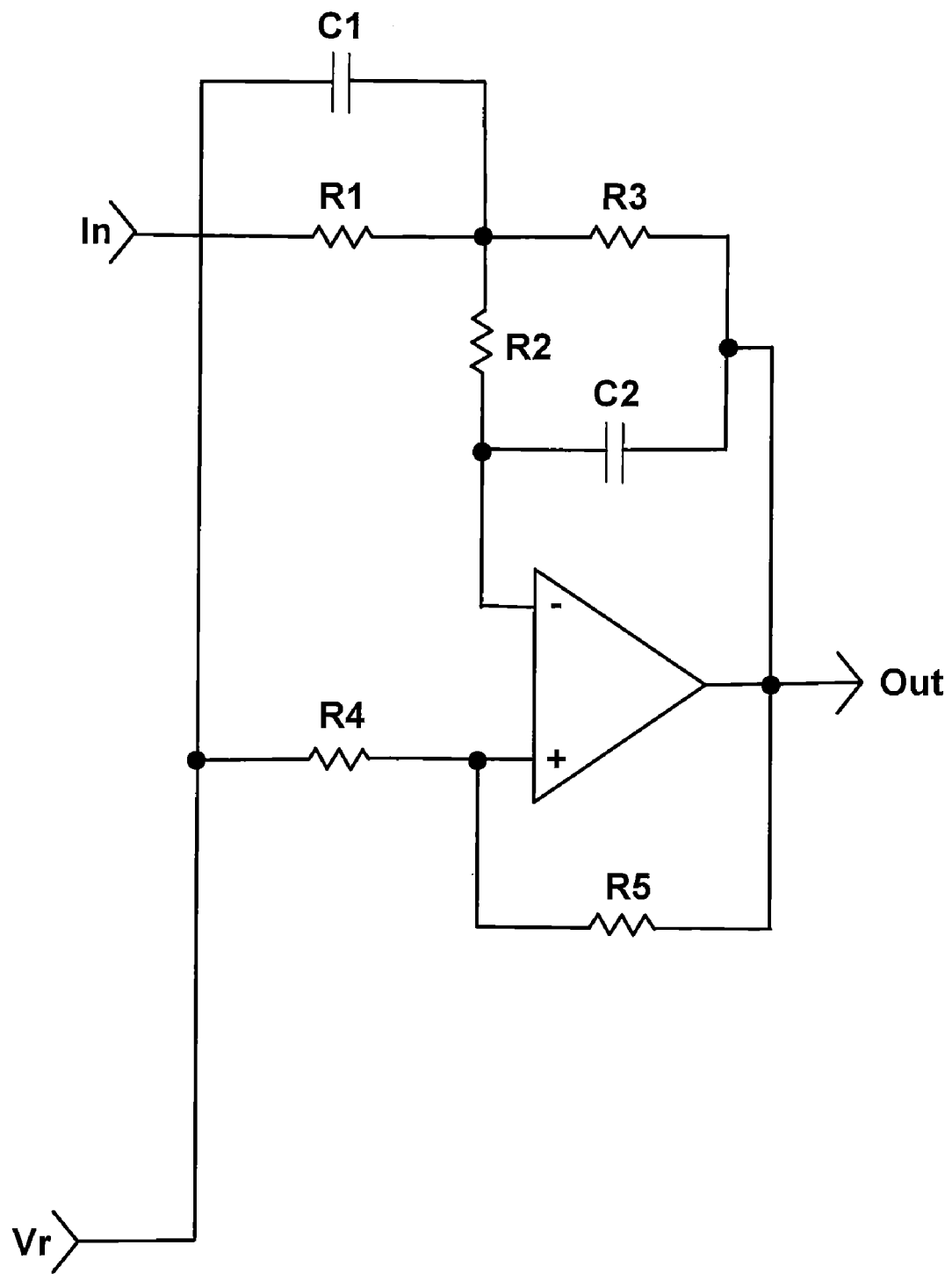
FIG. 23 is a circuit schematic of yet another example second order filter having characteristics similar to a low pass filter that can be included in the motional feedback system.
Figure 24:
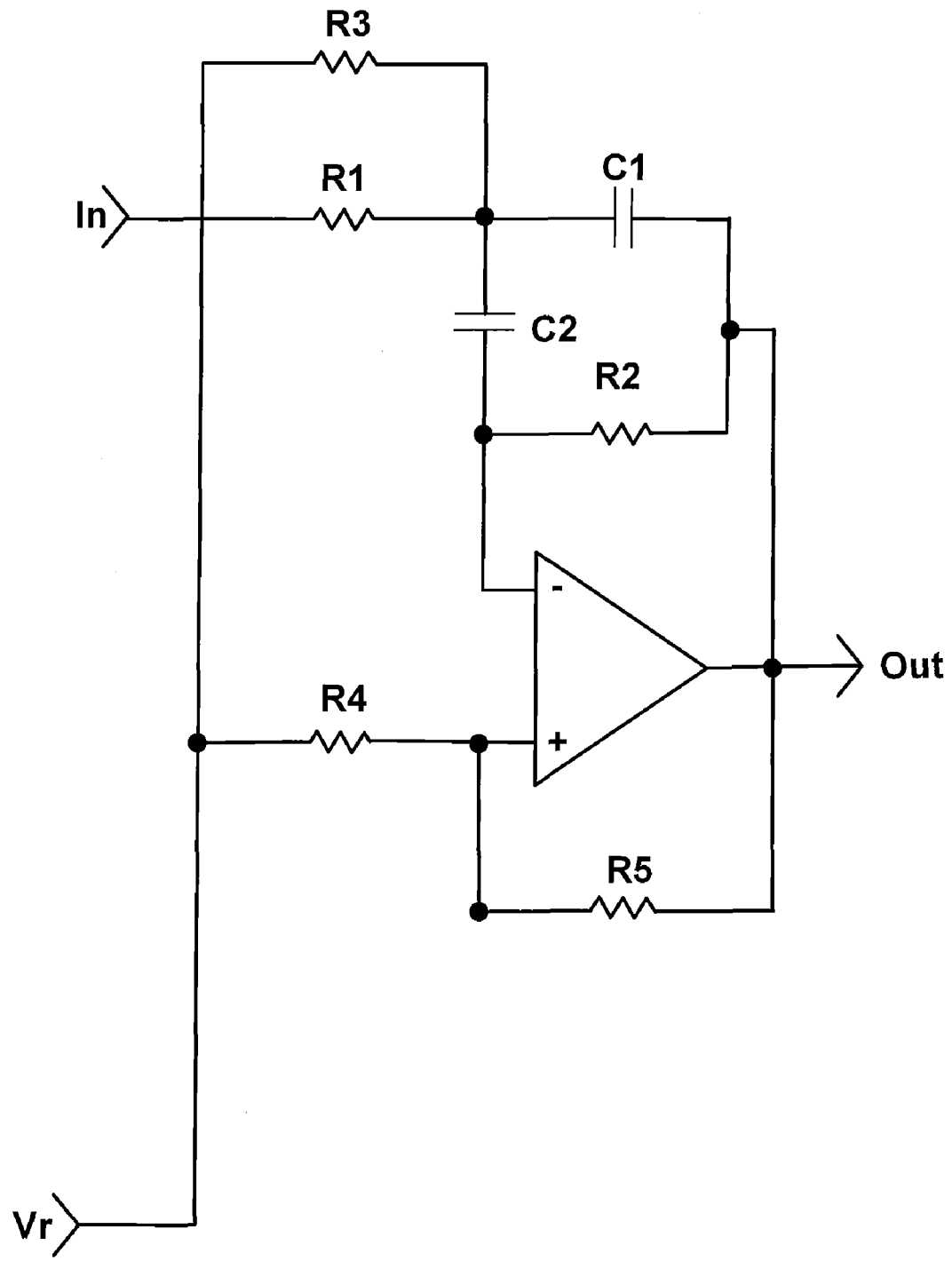
FIG. 24 is a circuit schematic of yet another example filter having characteristics similar to a band pass filter that can be included in the motional feedback system.
Figure 25:
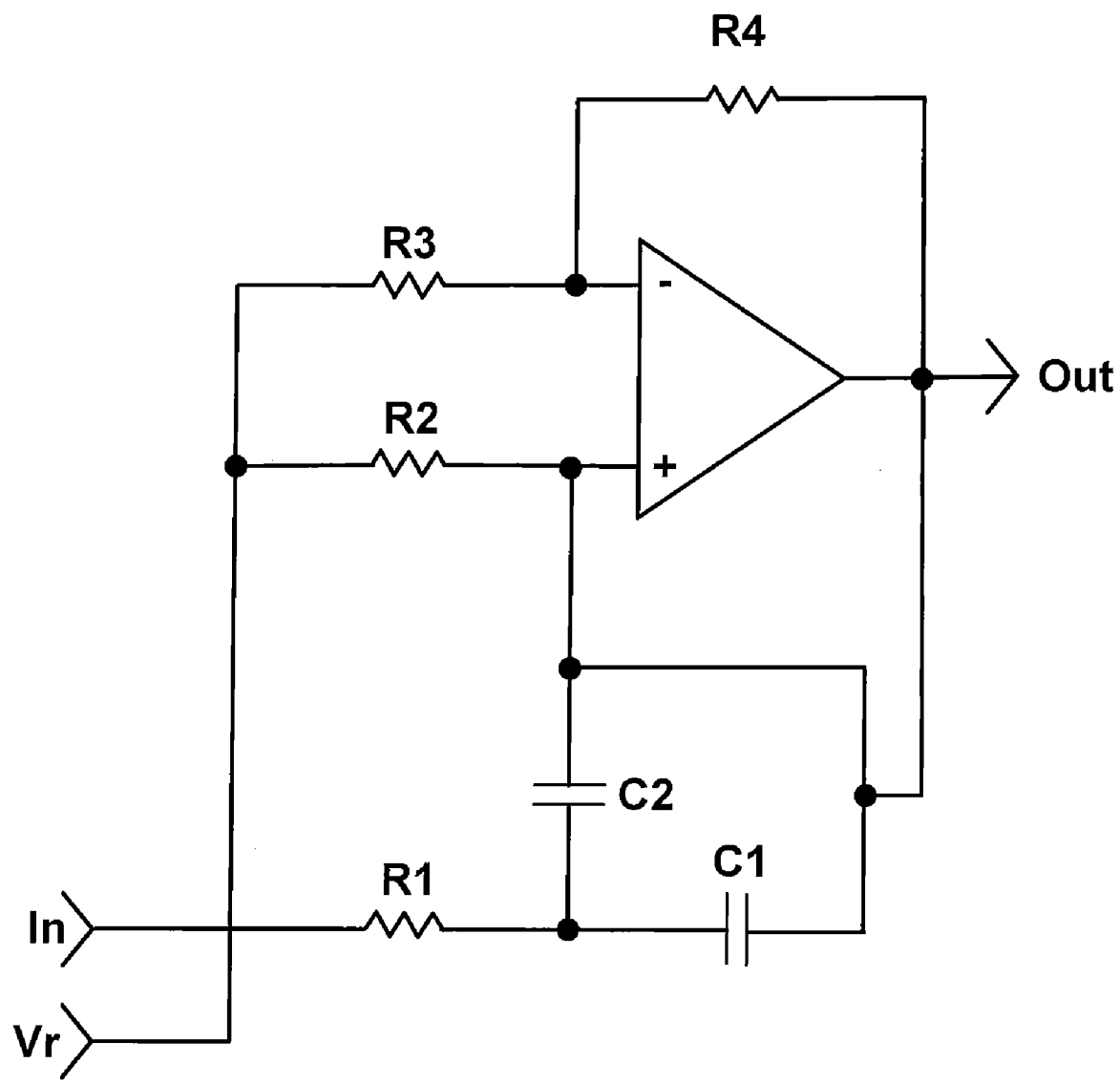
FIG. 25 is a circuit schematic of yet another example filter having characteristics similar to a band pass filter that can be included in the motional feedback system.
Figure 26:
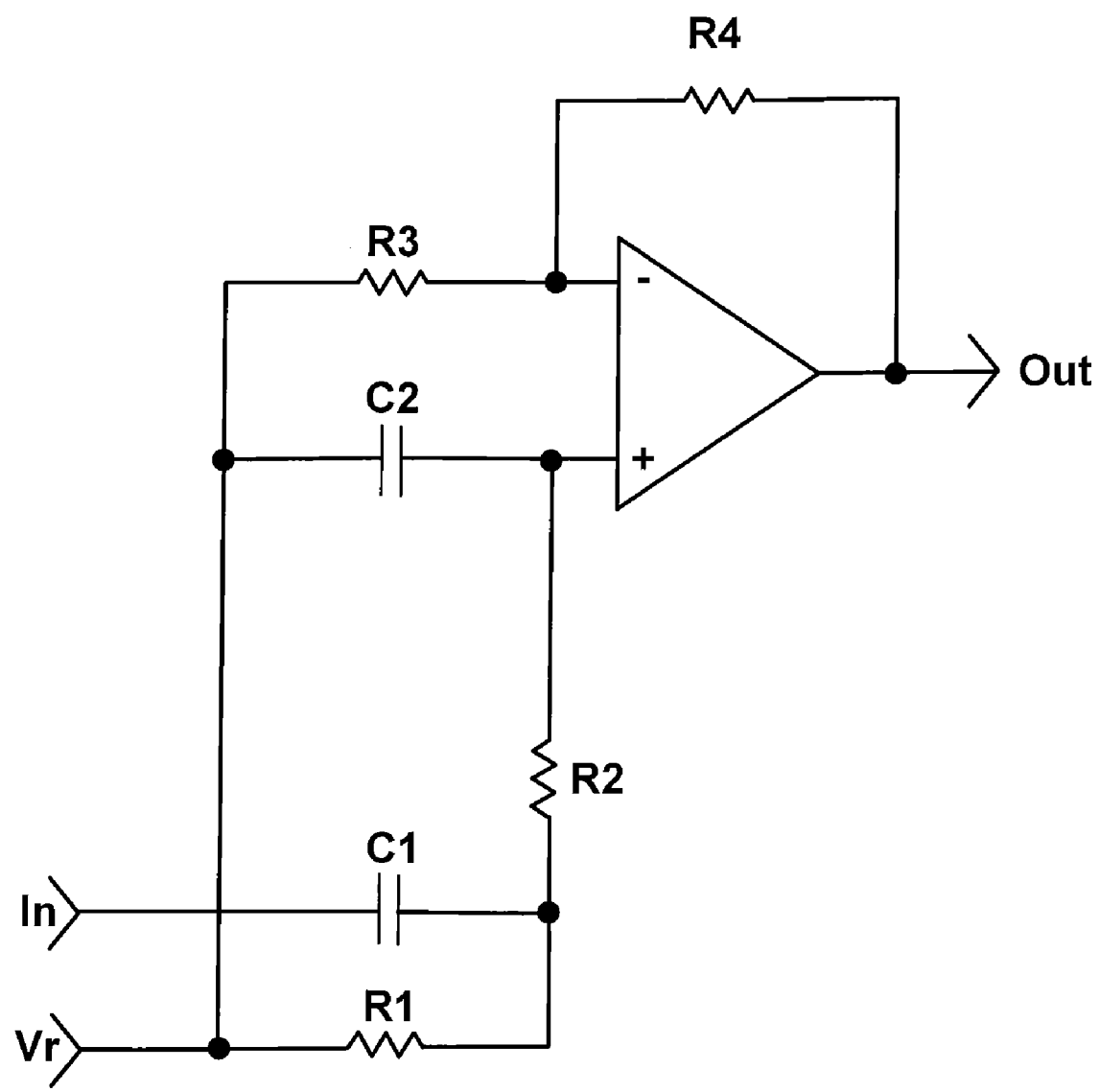
FIG. 26 is a circuit schematic of yet another example first order filter having characteristics similar to a buffered band pass filter that can be included in the motional feedback system.
Figure 27:
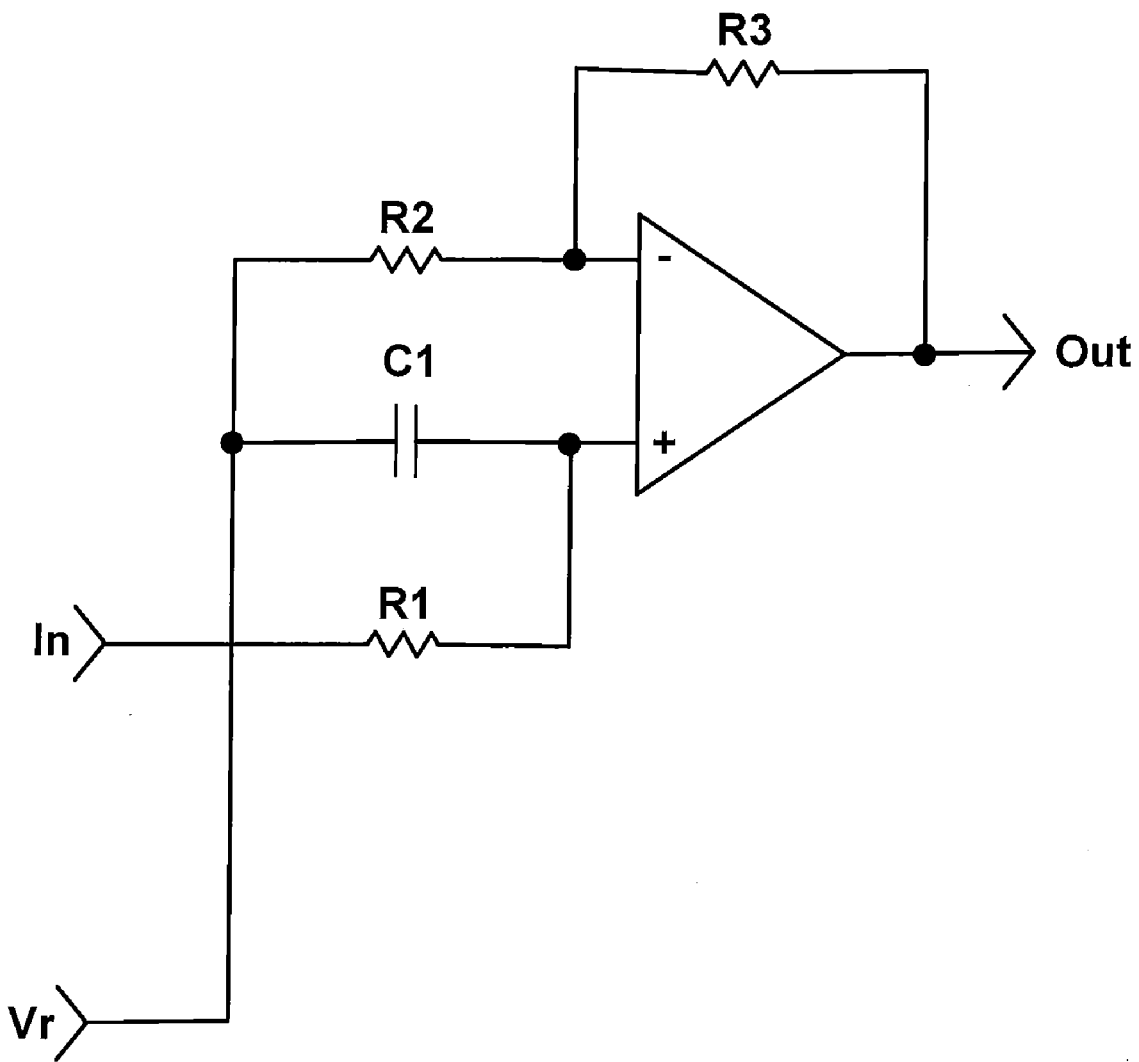
FIG. 27 is a circuit schematic of still another example first order filter having characteristics similar to a buffered low pass filter that can be included in the motional feedback system.
Figure 28:
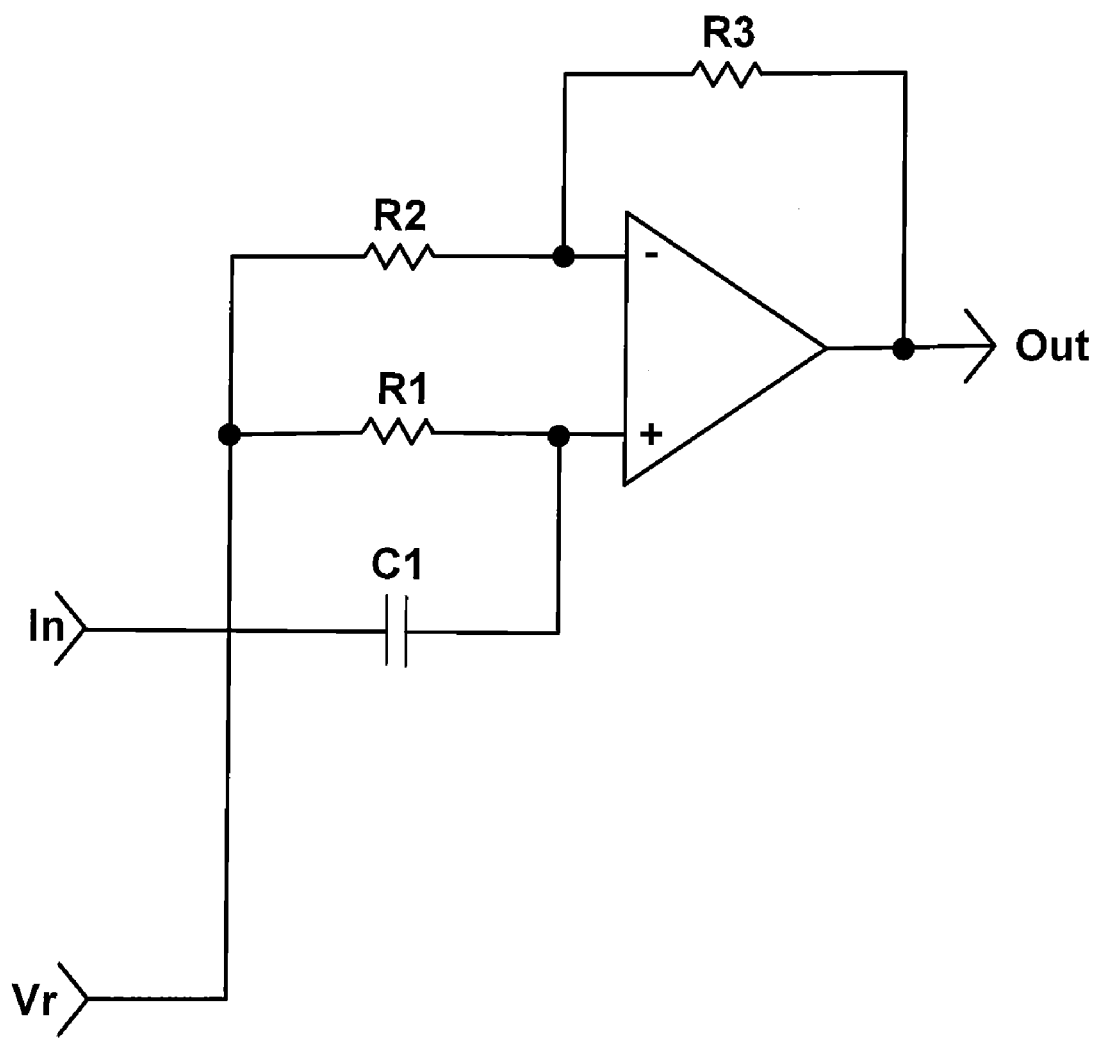
FIG. 28 is a circuit schematic of another example first order filter having characteristics similar to a buffered high pass filter that can be included in the motional feedback system.
Figure 29:
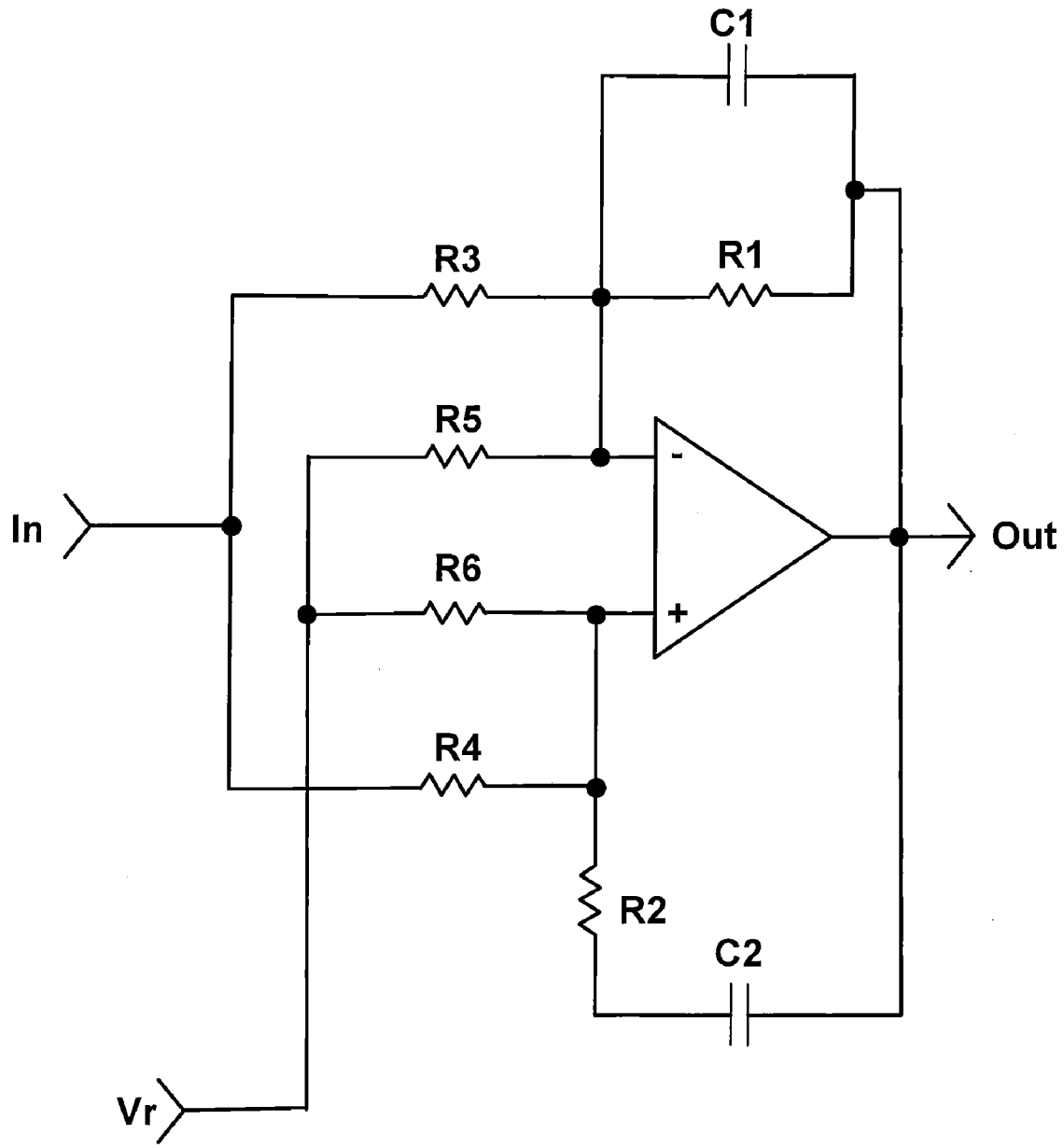
FIG. 29 is a circuit schematic of another example filter having characteristics similar to a high pass notch filter that can be included in the motional feedback system.
Figure 30:
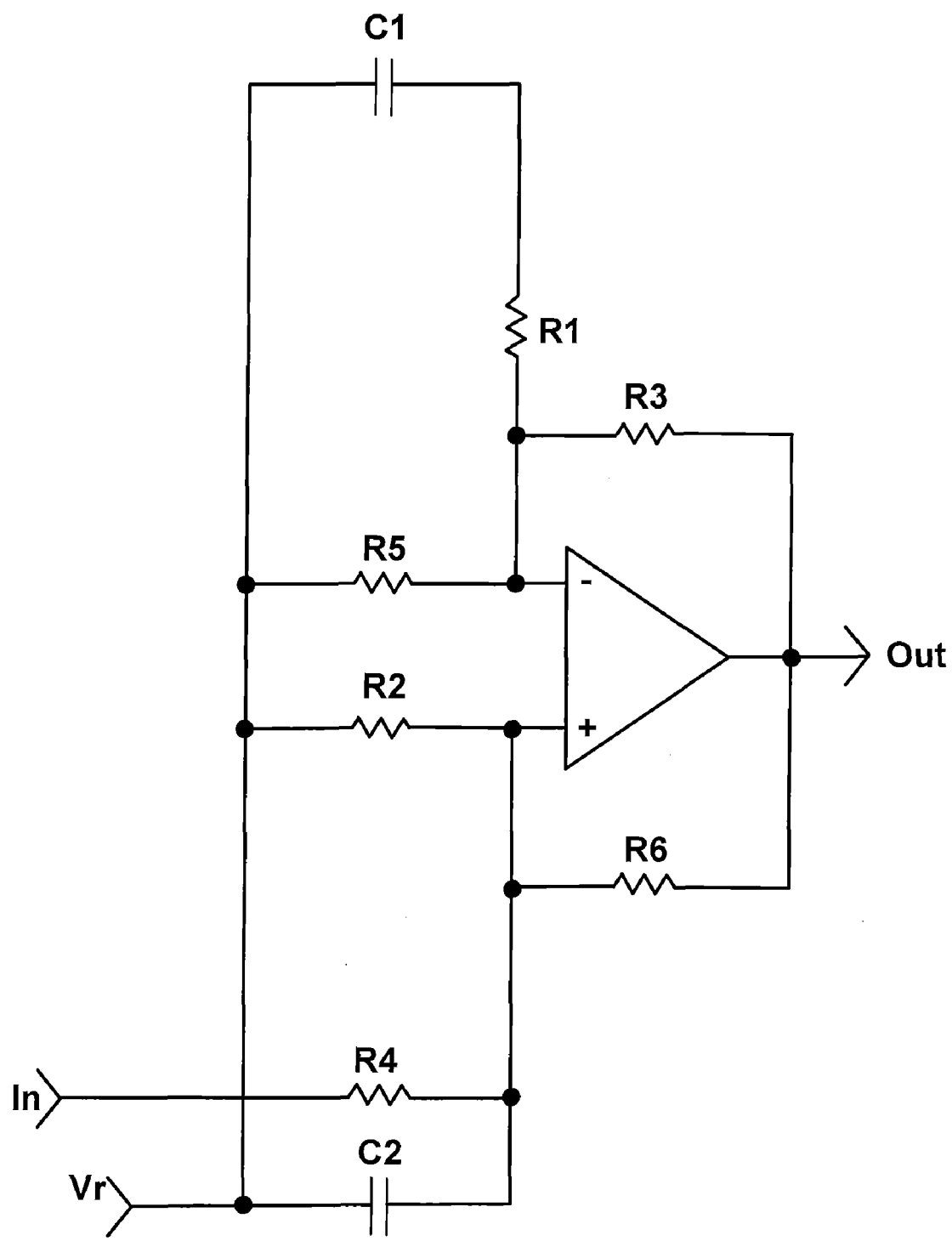
FIG. 30 is a circuit schematic of another example filter having characteristics similar to a high pass notch filter that can be included in the motional feedback system.

FIG. 13 is a block diagram illustrating a portion of an example motional feedback system 1300 included in an audio amplifier 104 operating within an audio system with a paired loudspeaker. The motional feedback system 1300 includes an example of a current sensor 1302 and a basic topology of a filter 1304 forming a feedback loop. In FIG. 13, the current sensor 1302 includes a balanced receiver 1306, an op-amp 1308, a first capacitor 1310, and a second capacitor 1312.

The balanced receiver 1306 is a matched resistor network having four inputs forming a first voltage input pair (A,B) 1316 and a second voltage input pair (C,D) 1318. The first voltage input pair (A,B) 1316 may receive a first voltage indicative of a first part of an output current Io(s) of the audio amplifier, and the second voltage input (C,D) 1318 may receive a second voltage indicative of a second part of an output current Io(s) of the audio amplifier. Two substantially identical flying shunts are used on a balanced output amplifier in this example. In other examples, the balanced receiver 1306 may receive a single voltage input, or more than two voltage inputs indicative of the output current Io(s) of the audio amplifier.

In FIG. 13, the audio amplifier 104 may include an output filter 1320 in some applications, such as for application of the audio amplifier and loudspeaker in a vehicle. The output filter 1320 may be one or more demodulation filters to minimize pulse width modulation spectra from the amplified output signal of the audio amplifier such that the waveform of the AC output voltage V0(s) of the amplified output signal is substantially free of visible ripple voltage. The output filter 1320 may include at least one capacitor and at least one inductor formed to be any type of inductor capacitor (LC) low pass filter. The inductor or coil (L) may act primarily as a common-mode filter. At this position in the output filter 1320 of the audio amplifier 104, the voltage potentials of the amplified output signal are greatly attenuated making it possible to process the voltages dropped across the resistances of the inductor (L) as a form of current shunts. The current shunts may be provided as differential inputs to the four inputs of the balanced receiver 1306—the first voltage input pairs (A,B) 1316 and the second voltage input pairs (C,D) 1318.

The balanced receiver 1306 includes input resistors 1322, feedback resistor 1324 and shunt-to-ground resistor 1326. Within the balanced receiver 1306, close matching of the resistance of the input resistors 1322 allows cancellation of the audio output voltages to occur at each input pin of the op-amp 1308, and all common mode voltages to cancel differentially between the input pins of the op-amp 1308. The result is that only the voltages dropped across the resistances and leakage inductance of the filter inductor paired with the audio amplifier remain as signals being gained up by the op-amp 1308 The leakage inductance of the inductor (L) may be relatively low such that only a small rise in output response may be present, that may be countered by paralleling the feedback resistors 1324 and the shunt-to-ground resistors 1326 of the balanced receiver 1306 with the first and second capacitors 1310 and 1312.

The input resistors 1322 may be built in the form of a resistor network where they share a common substrate temperature, origin and trimming in order to be closely matched. The feedback resistor 1324 and the shunt-to-ground resistor 1326 may also be matched as a pair and may share the same package. In order to increase the shunt resistance, resulting in increased voltage magnitudes on the first voltage input (A,B) 1316 and the second voltage input (C,D) 1318, the wire diameter of the inductor (L) may be reduced. Reduction in the wire diameter of the inductor (L) to the point of significant power loss, or the capability to sustain maximum operating current of the audio amplifier 104 should be avoided.

The inductor (L) of the audio amplifier 104 may include wire having a temperature coefficient similar to a copper temperature coefficient. Such a temperature coefficient is not a liability in this application since it is generally similar to the temperature coefficient of the wire used in the voice coil of the loudspeaker paired with the audio amplifier. When the audio amplifier and the loudspeaker are similarly exposed to temperature as would be the case in many applications, such as vehicle uses, the result is a system that can use more negative resistance with stability on the output of the audio amplifier than would otherwise be possible if the resistance of the inductor (L) and the loudspeaker 106 did not tend to track each other. This can be done without having to implement probe currents or a balancing servo.

The filter 1300 includes the filter input 202, the filter output 204, and receives the reference voltage Vr 220. In FIG. 13, the filter 1300 includes a single op-amp 1330 and otherwise depicts the topology of the filter 1300 generically as empty boxes into which various components, such as resistors and capacitors may be selectively positioned. The filter 1300 is depicted generically to illustrate the significant number of variations in the design of the transfer function of the filter 1304 that may be used to achieve the goal of controlling the variable output impedance Zo(s) of the audio amplifier to represent a negative impedance below a determined threshold frequency, and a positive output impedance above the determined threshold frequency. In that regard, FIGS. 14-30 provide a number of additional example topologies of the filter 120 that could be used to pair with different particular loudspeakers. The filter 1300 may be rendered with surface mount technology (SMT) components having the same footprint be they capacitors or resistors.

In FIG. 13, the filtered signal provided on the output 204 of the filter 1300 may be an AC signal that is coupled into a feedback summing node of the amplifier, such as the summer 122 (FIG. 1). Since the filter signal is an AC signal, the output 204 may include a capacitor 1332 and a resistor 1334. The capacitor 1332 may be sized to place a pole below the audio band yet allow DC offset errors of the current sensing system to be ignored by the amplifier. Such offsets can add to DC on the loudspeakers that may result in possible turn-on and turn-off noises that are audible.

Alternatively, in some situations there may be a different point of insertion of the filtered signal, than providing the filtered signal to the feedback summing node of the amplifier. Instead, where the design has a feedback receiver for the motional feedback system that is after the output filter, and that receiver has added gain at DC, a large capacitor (not shown) may be included that returns to a reference ground. The large capacitor may be used to inject the current feedback signal directly into the low frequency feedback path without adding another large capacitor. In every case the particularities of the architecture can be examined for the possible points of feedback injection since in other example amplifier/audio system designs, other insertion points for the feedback signal are possible.

After adding current feedback to an existing design, the entire signal path may need to be re-evaluated for proper signal dynamics and headroom. In general the formation of negative current feedback may result in a reduction of system gain. The dynamics of the input signal path may be such as to not allow overload when the output signal is driven to full power. Also all feedback signal paths should be examined to confirm they are free of overload wherever voltage and current feedback signals are locally summed. In general this results in gain rescaling of the design from what was in place with a traditional voltage source architecture. Gain rescaling may be accomplished by changing resistor values. Alternatively, or in addition, gain rescaling may involve changes to topology.

Broadband output noise may also be increased by adding current feedback since the current sensing system itself may produce noise which can be greater than the voltage feedback system. When current feedback is deployed on low-frequency transducers, it may be unlikely that the noise will be perceptible. Accordingly, with respect to noise issues, it may be beneficial to have a low noise architecture before one starts adding current feedback. Computer simulation may prove quite accurate as a means of predicting output noise and its spectrum in a given particular audio amplifier paired with a particular loudspeaker.

Figure 31:
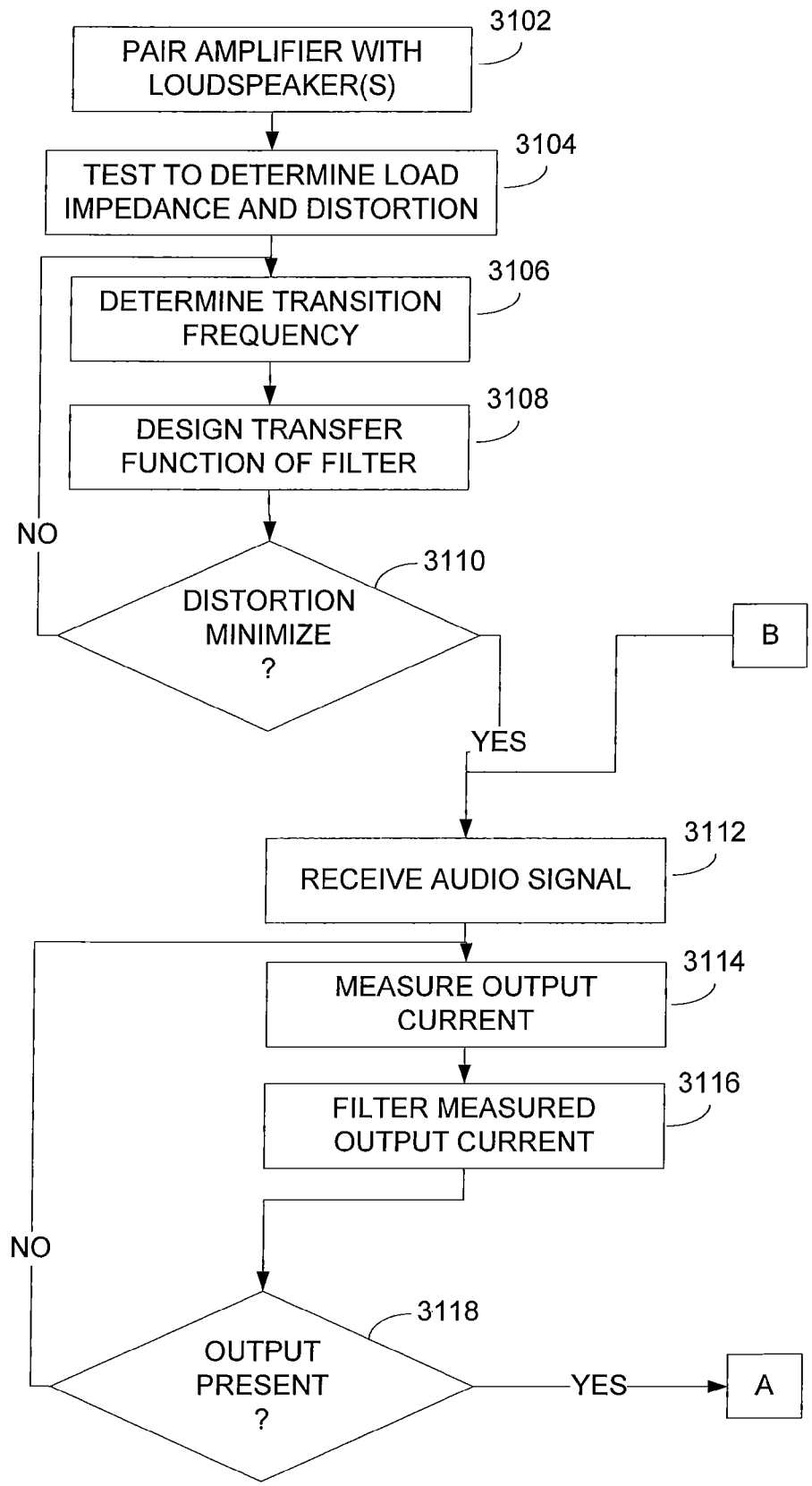
FIG. 31 is an example operational flow diagram of the motional feedback system.

FIG. 31 is an operation flow diagram illustrating example operation of the motional feedback system within an audio system with reference to FIGS. 1-30. At block 3102 the amplifier is paired with one or more particular loudspeakers. The particular loudspeakers are tested in conjunction with the audio amplifier, typically by modeling, to develop a representative load impedance and acoustic distortion at block 3104. At block 3106, a transitional frequency is determined for transitioning from a negative output impedance of the audio amplifier to a positive output impedance of the audio amplifier when the system receives an audio signal from an audio source 102. The transfer function H(s) of the filter is designed/selected to provide an optimum output source impedance Zo(s) of the audio amplifier that minimizes distortion due non-linear operational characteristics of the loudspeaker(s) and provides the determined transitional frequency at block 3108.

Figure 32:
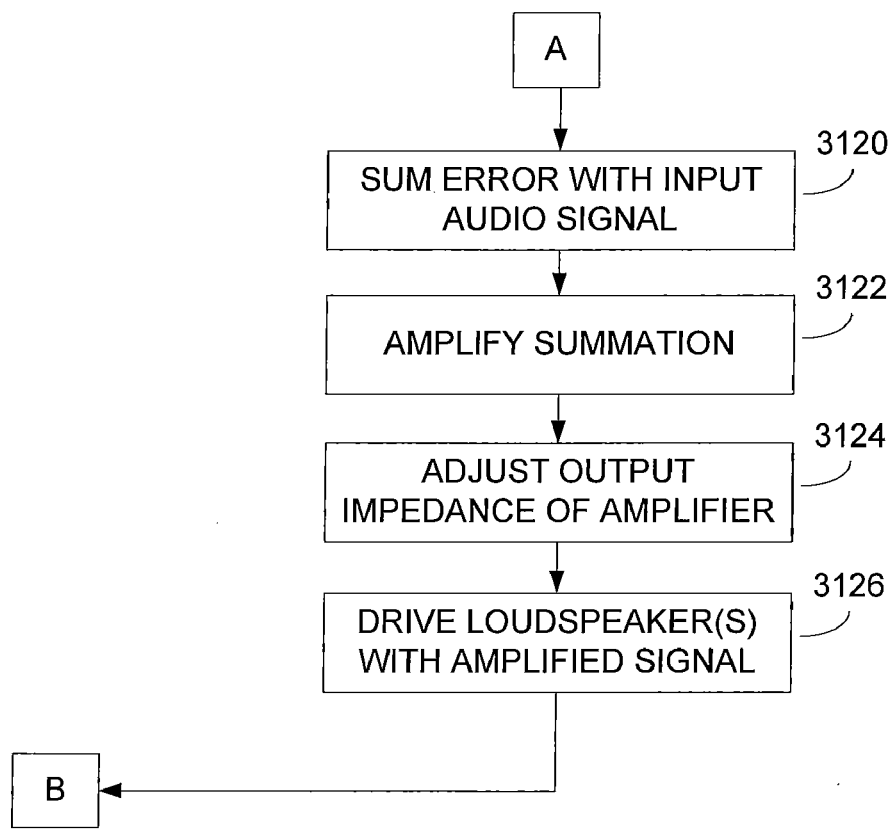
FIG. 32 is a second part of the operational flow diagram of FIG. 31.

At block 3110 it is determined if the output impedance Zo(s) of the audio amplifier minimizes distortion of the loudspeaker throughout the frequency range based on the transfer function H(s). If not, the operation returns to block 3106 to perform additional modeling, and choose/redesign the transfer function of the filter. If the distortion of the loudspeaker is satisfactorily minimized throughout the frequency range, the operation proceeds to block 3112 where the audio amplifier receives and amplifies an audio signal. In FIG. 32, the output current of the audio amplifier is measured or otherwise determined at block 3114. At block 3116 the measured output current is filtered with the filter and provided as a feedback error signal that may include positive feedback current in a first range of frequencies below the transition frequency, and negative feedback current in a second range of frequencies above the transition frequency.

It is determined if there is any error present, which is representative of undesired differences in the amplified voltage driving the loudspeaker at block 3118. The error signal may also be considered as representing undesired differences between the output impedance of audio amplifier and the load impedance of the loudspeaker(s) at low frequencies, and lack of domination of the loudspeaker impedance by the output impedance of the audio amplifier at high frequencies. If not, the operation returns to block 3114 to again measure the output current. If there is error present at block 3118, the operation proceeds to block 3120 where the feedback error signal is summed with the input audio signal over the frequency range of the audio signal. At block 3122, the summation of the input audio signal and the feedback error signal is amplified by the amplifier 14. The output impedance of the audio amplifier is adjusted as a result of the amplified output signal at block 3124. At block 3126 the amplified output signal is supplied to drive the loudspeaker(s) and the operation returns to block 3112 to repeat the closed loop control.

As previously discussed, an audio system containing an audio amplifier having a motional feedback system may result in lower distortion from loudspeakers included in the audio system. By pairing the particular loudspeaker(s) with the particular audio amplifier(s) non-linear behavior of the loudspeaker(s) and resulting distortion may be minimized. Minimization of the non-linear attributes of loudspeakers may be achieved at low frequencies by presenting an output impedance at an output of the amplifier that is substantially equal and opposite to the load impedance characteristics of the loudspeaker. At higher frequencies, minimization of the non-linear attributes of loudspeakers may be achieved by presenting an output impedance at the output of the amplifier that is substantially greater than the load impedance of the loudspeakers in order to minimize the effect of the load impedance of the loudspeakers.

Using a feedback loop containing a filter with a transfer function representative of the load impedance of the loudspeaker, the output impedance of the audio amplifier may be controlled to provide negative impedance in a low frequency region and at the same time provide a positive impedance in a high frequency region. A transitional threshold frequency may be determined and used to transition the output impedance between the negative impedance and the positive impedance. The resulting cancellation of load impedance of the loudspeaker at low frequencies, and domination of load impedance of the loudspeaker at high frequencies may minimize distortion throughout the range of operational frequency by minimizing non-linear operation of the loudspeaker. Domination at high frequencies is due to the non-linear leakage inductance impedance of the loudspeaker being substantially less than the positive output impedance of the amplifier and is thereby rendered less significant in the circuit's current.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

I claim:

1. A motional feedback system for minimizing non-linear distortion of loudspeakers comprising:
   an audio amplifier having an output with a variable output impedance, the output configured to supply an amplified audio signal to drive a loudspeaker paired with the audio amplifier;
   a current sensor configured to sense a current of the amplified audio signal supplied at the output, and supply the current as a feedback current to the audio amplifier to minimize distortion of the loudspeaker;
   an impedance control module included in the audio amplifier, the impedance control module comprising an active filter having a transfer function H(s) that substantially matches a load impedance of the loudspeaker paired with the amplifier, and the transfer function H(s) providing a frequency dependent phase inversion and a frequency dependent gain in order to control the variable output impedance as a function of the frequency of the audio signal to selectively transition the feedback current between a positive feedback current in a first range of frequencies, and a negative feedback current in a second range of frequencies that are higher than the first range of frequencies;
   the impedance control module configured to synthesize the output impedance using the positive feedback current of the transfer function H(s) of the active filter to represent a negative impedance below a determined threshold frequency; and
   the impedance control module further configured to synthesize the output impedance using the negative feedback current of the transfer function H(s) of the active filter to represent a positive impedance above the determined threshold frequency.

2. The motional feedback system of claim 1, where the active filter is included in a feedback loop responsive to the current of the amplified audio signal supplied to the loudspeaker.

3. The motional feedback system of claim 1, where the transfer function H(s) is representative of an optimum source impedance to minimize non-linear distortion of the loudspeaker.

4. The motional feedback system of claim 1, where the frequency dependent phase inversion is configured to occur within a transition band around the determined threshold frequency.

5. The motional feedback system of claim 1, where the impedance control module is configured to control the variable output impedance of the audio amplifier based on the transfer function H(s) and a current of the amplified audio signal supplied to the loudspeaker.

6. The motional feedback system of claim 1, where the active filter comprises a single operational amplifier.

7. The motional feedback system of claim 1, where the determined threshold frequency is a user specified transition band of frequencies.

8. The motional feedback system of claim 1, where the current sensor is coupled with the filter and the output, and the impedance control module further comprises a summer coupled between the filter and an output amplifier configured to supply the output.

9. The motional feedback system of claim 1, where the active filter comprises a filter input configured to receive a voltage indicative of an output current supplied on the output, the active filter further comprising a filter output configured to provide an error signal generated by application of the transfer function H(s) to the received voltage indicative of the output current.

10. The motional feedback system of claim 9, where application of the transfer function H(s) to the received voltage indicative of the output current results in frequency based phase and gain adjustments to the received voltage indicative of the output current.

11. A method of minimizing non-linear distortion of a loudspeaker comprising:
    receiving an audio signal from an audio source;

amplifying the audio signal with an audio amplifier;
driving a loudspeaker with the amplified audio signal using an output of the audio amplifier, the loudspeaker being paired with the audio amplifier, and the output having a controlled output impedance;
synthesizing the controlled output impedance using an active filter having a transfer function H(s) that substantially matches a load impedance of the loudspeaker paired with the amplifier and the transfer function H(s) providing a frequency dependent phase inversion and a frequency dependent gain in order to present a negative impedance below a determined threshold frequency; and
synthesizing the controlled output impedance with the active filter in order to present a positive impedance above the determined threshold frequency;
where synthesizing the output impedance to present the negative impedance and synthesizing the output impedance to present the positive impedance comprises transitioning a feedback current between a positive current feedback below the determined threshold frequency, and a negative current feedback above the determined threshold frequency using the transfer function H(s).

12. The method of claim 11, where synthesizing the controlled output impedance to present the negative impedance and synthesizing the controlled output impedance to present the positive impedance comprises monitoring a current supplied in the amplified audio signal with the audio amplifier, and optimizing the controlled output impedance for the loudspeaker using a current feedback loop to minimize loudspeaker distortion.

13. The method of claim 11, where synthesizing the controlled output impedance to present the negative impedance and synthesizing the controlled output impedance to present the positive impedance comprises applying a frequency based gain of a filter response to a frequency spectrum of an output current of the amplified audio signal, and approximating a control source impedance for the loudspeaker to minimize loudspeaker distortion.

14. The method of claim 11, where synthesizing the output impedance to present the negative impedance comprises applying a first gain of a filter response to a first range of frequency of a current included in the audio signal below the threshold determined frequency, and synthesizing the output impedance to present the positive impedance comprises applying a second gain to a second range of frequency of the current of audio signal above the threshold determined frequency.

15. The method of claim 11, where synthesizing the output impedance to present the negative impedance and synthesizing the output impedance to present the positive impedance comprises modifying an input audio signal provided to the audio amplifier with an error signal generated with the transfer function H(s) in a feedback loop, the modified input audio signal amplified with the audio amplifier and provided to the loudspeaker to minimize non-linear distortion.

16. The method of claim 11, where synthesizing the output impedance to present the negative impedance comprises substantially negating a part of the load impedance which is substantially representative of a voice coil of the loudspeaker, and controlling the output impedance to the positive impedance comprises substantially exceeding a part of the load impedance which is substantially representative of a leakage inductance of the loudspeaker.

17. A computer readable storage media configured to store computer readable instructions that are executable by a processor to minimizing non-linear distortion of loudspeakers, the computer readable storage media comprising:
instructions to receive an audio signal from an audio source, the audio source including a plurality of frequencies;
instructions to process the audio signal with an audio amplifier;
instructions to enable output of the processed audio signal on an audio output of the audio amplifier to drive a loudspeaker, the audio output having an output impedance, and the loudspeaker paired with the audio amplifier;
instructions to receive a feedback current;
instructions to synthesize the output impedance of the audio amplifier to present a negative impedance using an active filter having a transfer function H(s) that substantially matches a load impedance of the loudspeaker paired with the amplifier, the transfer function H(s) providing a frequency dependent phase inversion and a frequency dependent gain such that the feedback current is a positive feedback current, and the negative impedance is presented at the audio output for a first band of frequencies of the audio signal below a determined threshold frequency; and
instructions to synthesize the output impedance of the audio amplifier to present a positive impedance at the audio output for a second band of frequencies of the audio signal above the determined threshold frequency in response to the transfer function H(s) providing the feedback current as a negative feedback current in the second band of frequencies, the second band of frequencies being higher than the first band of frequencies.

18. The computer readable storage media of claim 17, further comprising instructions to operate a current feedback loop that includes the active filter, the transfer function H(s) being substantially representative of an optimum source impedance for the loudspeaker over the first band of frequencies and the second band of frequencies.

19. The computer readable storage media of claim 18, where the frequency dependent gain and the frequency dependent phase inversion of the transfer function H(s) are configured so that the phase transitions from a negative phase below the determined threshold frequency to a positive phase above the determined threshold frequency.

20. The computer readable storage media of claim 19, where the frequency dependent gain of the transfer function H(s) within the first band of frequencies is less than the frequency dependent gain of the transfer function H(s) within the second band of frequencies.

21. A motional feedback system for loudspeakers comprising:
an audio amplifier having an input and an output, the input configured to receive an audio signal, and the output configured to supply an amplified version of the audio signal, the amplified version of the audio signal used to drive a loudspeaker paired with the audio amplifier;
a current sensor configured to sense a current of the amplified audio signal supplied at the output, and supply the current as a feedback current to the audio amplifier to minimize distortion of the loudspeaker; and
an active filter included in the audio amplifier and coupled with the current sensor, the active filter having a transfer function H(s) that substantially matches a load impedance of the loudspeaker paired with the amplifier, the transfer function H(s) providing a frequency dependent phase inversion and a frequency dependent gain in order to selectively transition the feedback current between a positive feedback current in a first range of frequencies, and a negative feedback current in a second range of frequencies that are higher than the first range of frequencies.

22. The motional feedback system of claim 21, where the active filter is configured with a determined transitional bandwidth of frequency within which the selective transition between the positive feedback current and the negative feedback current occurs.

23. The motional feedback system of claim 21, where the amplifier is configured to present an output impedance to the loudspeaker in response to the positive feedback current and the negative feedback current, the output impedance being a negative impedance in the first range of frequencies and a positive impedance in the second range of frequencies.

24. The motional feedback system of claim 23, where, the negative impedance is representative of a resistance of the loudspeaker in the first range of frequencies, and the positive impedance exceeds an impedance of the loudspeaker in the second range of frequencies.

25. A method of minimizing non-linear distortion of loudspeakers comprising:
receiving an audio signal from an audio source, the audio source including a plurality of frequencies;
amplifying the audio signal with an audio amplifier having an output with a variable output impedance;
driving a loudspeaker paired with the audio amplifier with the amplified audio signal;
monitoring a current supplied in the amplified audio signal;
supplying the monitored current to an active filter having a transfer function H(s) that substantially matches a load impedance of the loudspeaker paired with the amplifier, the transfer function H(s) providing a frequency dependent phase inversion and a frequency dependent gain in order to control the variable output impedance as a function of the frequency of the audio signal;
synthesizing the output impedance of the audio amplifier using the transfer function H(s) of the active filter to be a negative impedance for those frequencies below a determined threshold frequency based on the monitored current being provided by the transfer function H(s) as a positive feedback current; and
synthesizing the output impedance of the audio amplifier using the transfer function H(s) of the active filter to be a positive impedance for those frequencies above the determined threshold frequency based on the monitored current being provided by the transfer function H(s) as a negative feedback current.

* * * * *